(12) United States Patent
Yamazaki

(10) Patent No.: US 6,770,546 B2
(45) Date of Patent: Aug. 3, 2004

(54) METHOD OF MANUFACTURING SEMICONDUCTOR DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/206,577

(22) Filed: Jul. 29, 2002

(65) Prior Publication Data

US 2003/0021307 A1 Jan. 30, 2003

(30) Foreign Application Priority Data

Jul. 30, 2001 (JP) ........................................ 2001-230692
Aug. 10, 2001 (JP) ........................................ 2001-245089

(51) Int. Cl.[7] .................. H01L 21/00; H01L 21/20; H01L 21/4763; H01L 21/26
(52) U.S. Cl. .................. 438/487; 438/378; 438/478; 438/622; 438/795; 438/166
(58) Field of Search .................. 438/166, 378, 438/487, 662, 795

(56) References Cited

U.S. PATENT DOCUMENTS

| | | | |
|---|---|---|---|
| 4,330,363 A | 5/1982 | Biegesen et al. | |
| 4,370,175 A | 1/1983 | Levatter | |
| 5,854,803 A | 12/1998 | Yamazaki et al. | |
| 6,110,291 A | * 8/2000 | Haruta et al. | 118/726 |
| 6,172,820 B1 | * 1/2001 | Kuwahara | 359/719 |
| 6,210,996 B1 | 4/2001 | Yamazaki et al. | |

FOREIGN PATENT DOCUMENTS

| | | |
|---|---|---|
| JP | 62-104117 | 5/1987 |
| JP | 02-181419 | 7/1990 |
| JP | 08-195357 | 7/1996 |

* cited by examiner

Primary Examiner—John F. Niebling
Assistant Examiner—Stanetta Isaac
(74) Attorney, Agent, or Firm—Jeffrey L. Costellia; Nixon Peabody LLP

(57) ABSTRACT

A laser treatment apparatus is provided which is capable of irradiating a laser beam to the position where a TFT is to be formed over the entire surface of a large substrate to achieve the crystallization, thereby forming a crystalline semiconductor film having a large grain diameter with high throughput. A laser treatment apparatus includes a laser oscillation device, a lens for converging a laser beam, such as a collimator lens or a cylindrical lens, a fixed mirror for altering an optical path for a laser beam, a first movable mirror for radially scanning a laser beam in a two-dimensional direction, and an fθ lens for keeping a scanning speed constant in the case of laser beam scanning. These structural components are collectively regarded as one optical system. A laser treatment apparatus shown in FIG. 1 has a structure in which five such optical systems are placed. The number of optical systems is not limited; any number of optical systems is allowed as long as a means for supplying a plurality of laser beams is provided.

22 Claims, 25 Drawing Sheets

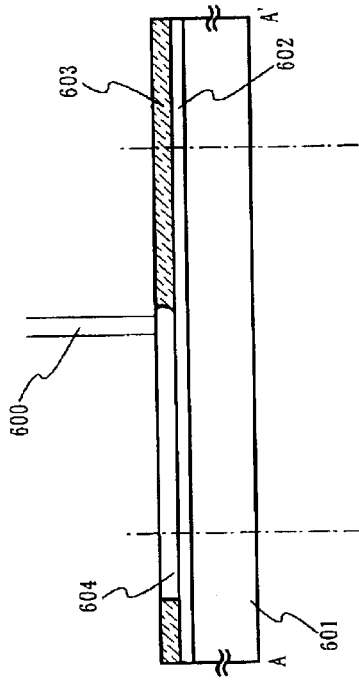
Fig. 14(1-A)
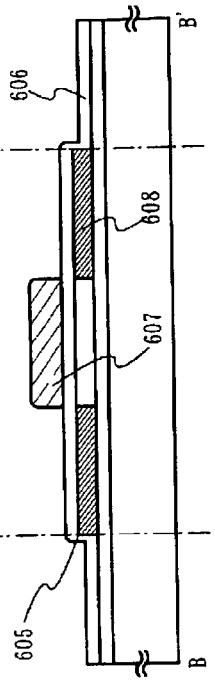
Fig. 14(1-B)
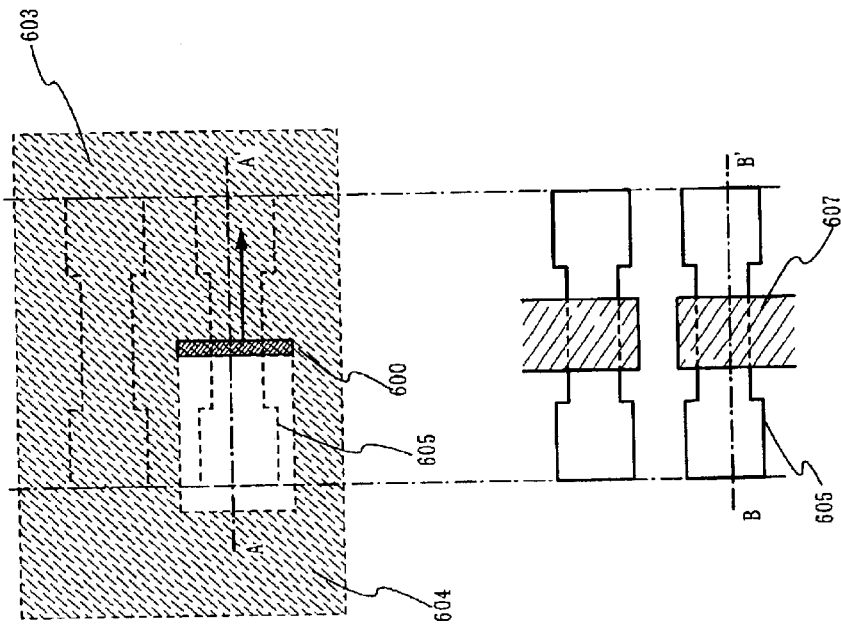
Fig. 14(2-A)
Fig. 14(2-B)

Fig. 21A  Fig. 21B
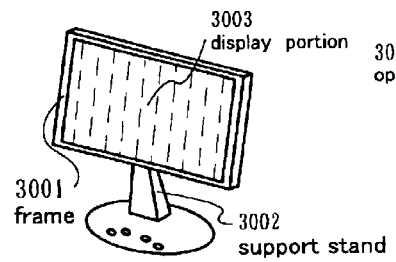
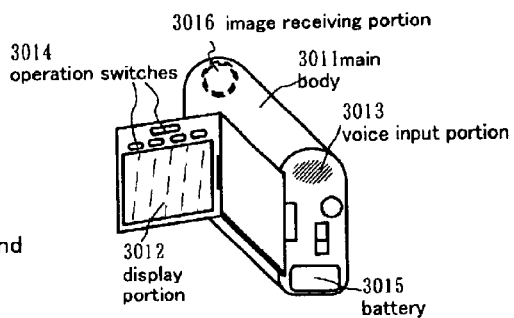
Fig. 21C  Fig. 21D
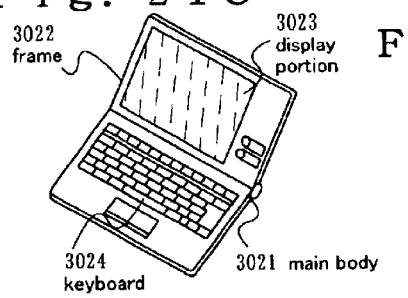
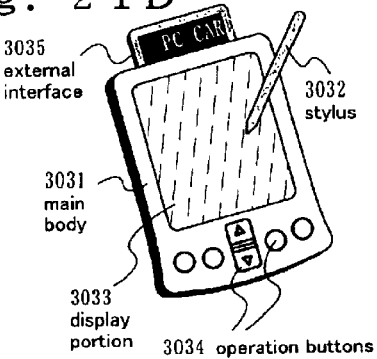
Fig. 21E
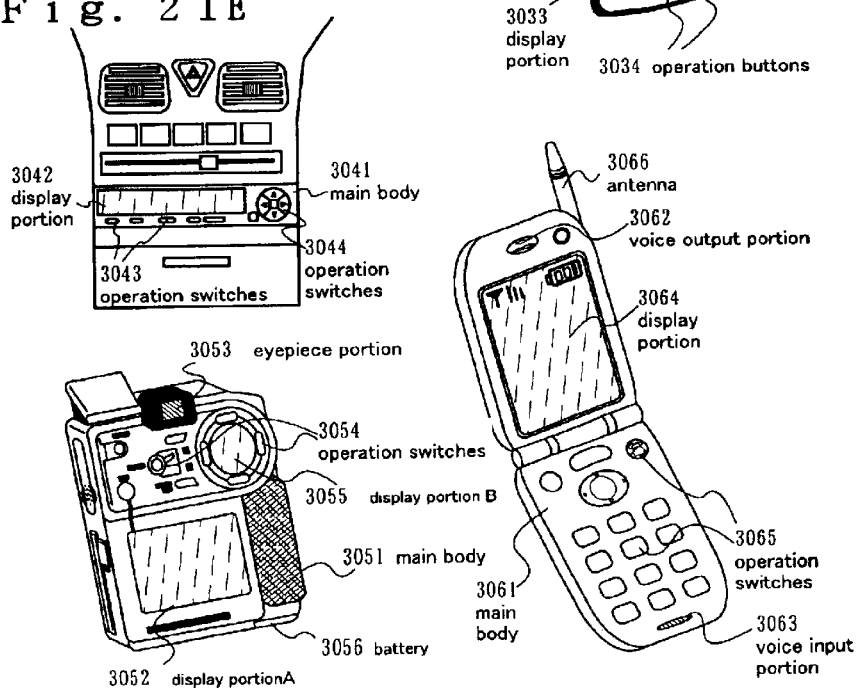
Fig. 21F  Fig. 21G

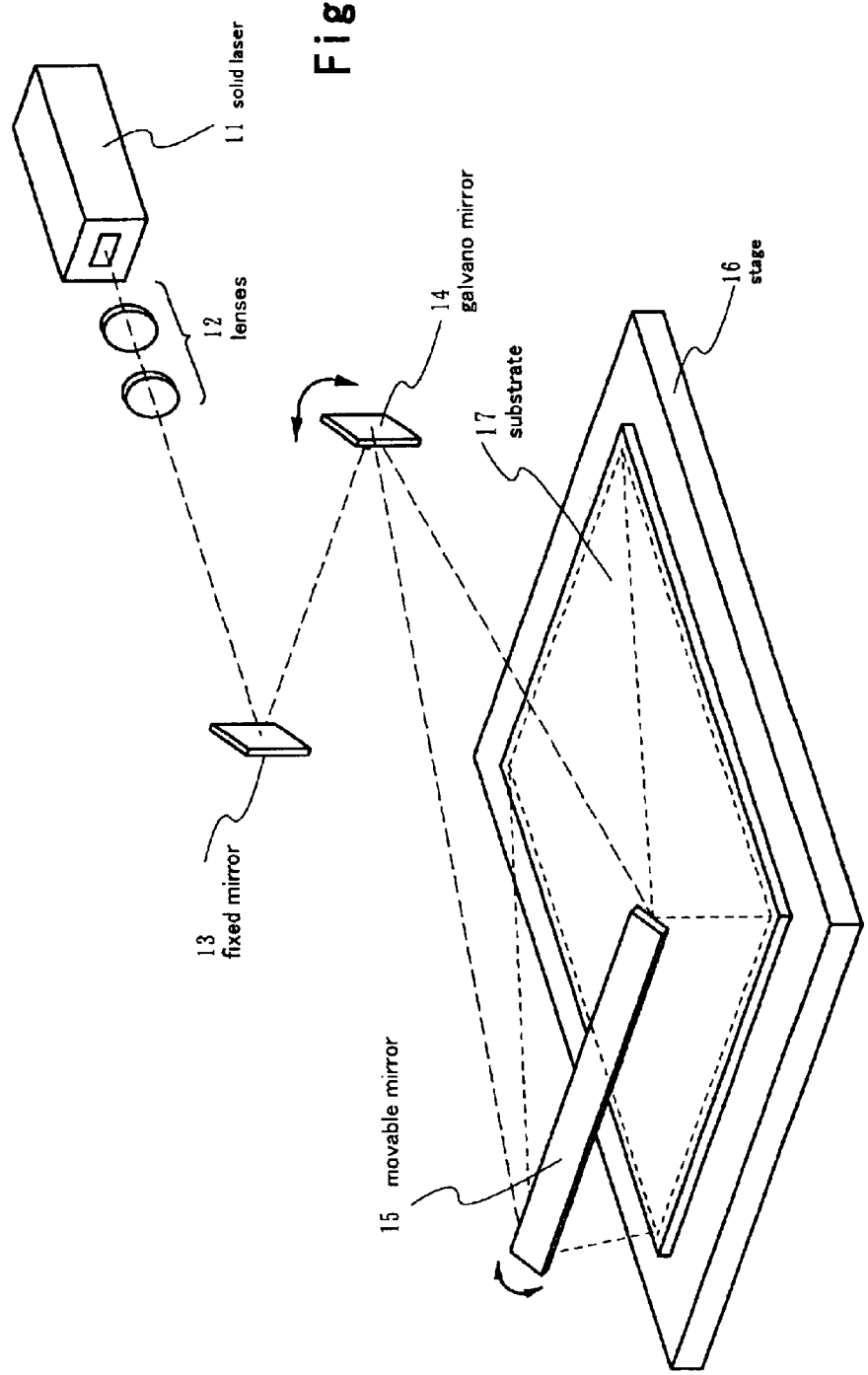

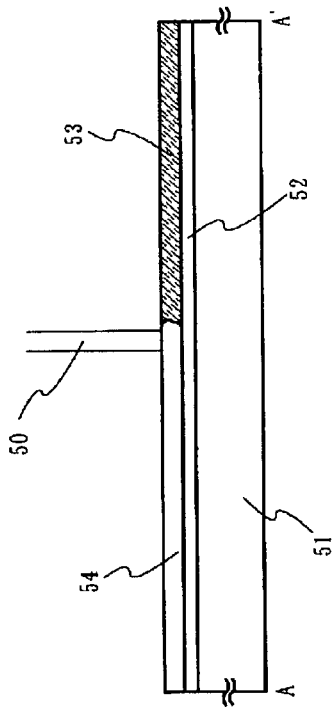
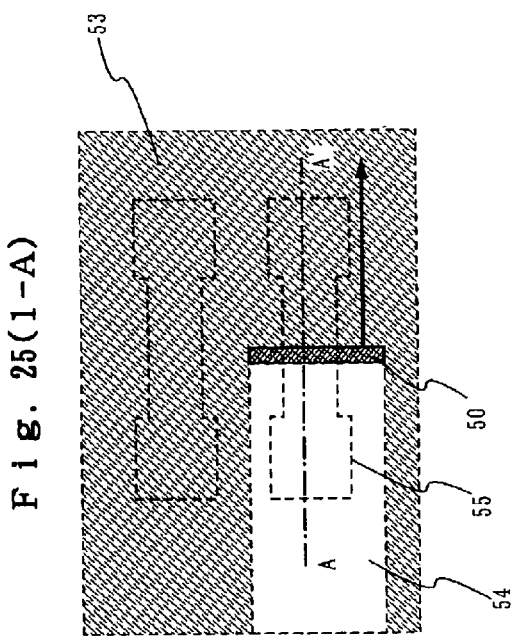
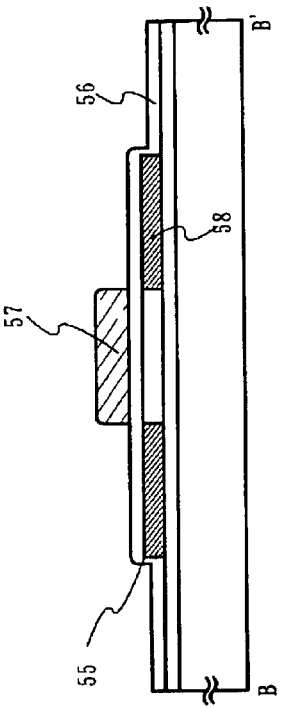
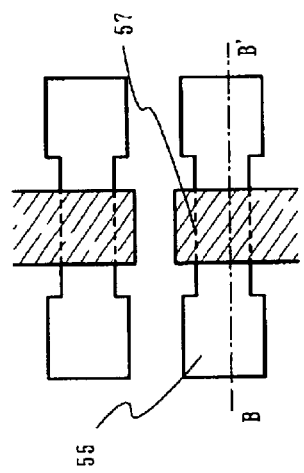
Fig. 25(1-A)
Fig. 25(1-B)
Fig. 25(2-A)
Fig. 25(2-B)

METHOD OF MANUFACTURING SEMICONDUCTOR DEVICE

BACKGROUND OF THE INVENTION

1. Field of the Invention

The present invention relates to a laser treatment apparatus for crystallization or activation after ion implantation, of a semiconductor substrate, a semiconductor film or the like using a laser beam and to a method of manufacturing a semiconductor device using such a laser treatment apparatus.

2. Description of the Related Art

Laser annealing is performed to crystallize a semiconductor wafer or a non-single crystalline semiconductor film in a semiconductor manufacturing process or to recover the crystallinity after ion implantation. A conventional laser annealing method involves a method of uniformly irradiating the entire surface of an object with a laser beam as is disclosed in JP 2-181419 A, a method of scanning a spot-shaped beam as is disclosed in JP 62-104117 A, or a method of irradiating a linearly processed beam obtained by an optical system as in a laser treatment apparatus disclosed in JP 8-195357 A.

The term "laser annealing" herein indicates a technique for recrystallizing a damaged layer or an amorphous layer formed in a semiconductor substrate or a semiconductor film or a technique for crystallizing an amorphous semiconductor film formed on a substrate. The "laser annealing" also includes a technique that is applied to leveling or improvement of a surface quality of the semiconductor substrate or the semiconductor film. Applicable laser oscillation devices are: gas laser oscillation devices represented by an excimer laser; and solid laser oscillation devices represented by a YAG laser. Such laser oscillation devices are known to heat a surface layer of a semiconductor by laser beam irradiation for an extremely short period of time, i.e., about several tens to several hundreds of nanoseconds so as to crystallize the surface layer.

For example, the above-cited JP 62-104117 A discloses a technique of polycrystallizing an amorphous semiconductor film with a laser beam scanning speed set so as to be beam spot diameter×5000/seconds or higher, without bringing the amorphous semiconductor film into a completely melted state. U.S. Pat. No. 4,330,363 B discloses a technique of irradiating a semiconductor region formed in an island-like shape with an elongated laser beam to substantially form a single-crystalline region.

The laser annealing is characteristic in that a treatment time period can be remarkably reduced as compared with annealing utilizing radiant heating or thermal conductive heating, that a semiconductor or a semiconductor film is selectively and locally heated so that a substrate is scarcely thermally damaged, and the like.

Recently, the laser annealing has been positively utilized for forming a polycrystalline silicon film on a glass substrate. This formation process is applied to the manufacture of a thin film transistor (TFT) which is used as a switching element of a liquid crystal display device. Since only a region where a semiconductor film is formed is thermally affected with the use of an excimer laser, the laser annealing with the excimer laser allows the use of a cheap glass substrate, thereby realizing the application of a glass substrate to a large display.

Moreover, since a TFT, which is manufactured of a polycrystalline silicon film crystallized by the laser annealing, can be driven at a relatively high frequency, not only a switching element provided at a pixel but also a driver circuit can be formed on a glass substrate. A pattern design rule is about 5 to 20 $\mu$m. Thus, about $10^6$ to $10^7$ TFTs are formed in a driver circuit and a pixel portion on the glass substrate, respectively.

The crystallization of amorphous silicon by laser annealing is achieved through a process of melt-solidification. More specifically, this process is regarded as a two-stage process consisting of: the generation of crystal nuclei; and the crystal growth from the crystal nuclei. However, the laser annealing using a pulsed laser beam is not capable of controlling the positions where crystal nuclei are formed and the density of the formed crystal nuclei, leaving the crystal nuclei spontaneously generated. Therefore, crystal grains are formed at arbitrary positions in a plane of a glass substrate. Moreover, the size of the obtained crystal grain is small, i.e., about 0.2 to 0.5 $\mu$m. A number of defects are generated at crystal grain boundaries, which is regarded as a primary factor of limiting a field effect mobility of the TFT.

In a technique related to the above-mentioned JP 62-104117 A, however, the crystal growth due to crystal nuclei which are believed to be formed in an unmelted region is dominant because a semiconductor film is not completely melted. As a result, the increase in size of crystal grains cannot be realized. More specifically, substantially single-crystalline crystals cannot be formed over the entire surface of a semiconductor film on which a channel region of a TFT is to be formed.

In the first place, a crystallization method with continuous wave laser scanning while effecting melt-solidification is considered to be close to a zone melting method. Although a high energy density is required to melt a semiconductor, this crystallization method has drawbacks in that it is difficult to realize a high output with the continuous wave laser, resulting in increase in apparatus size. Ultimately, the beam size is reduced through an optical system to be radiated to a semiconductor. With such beam size, however, a considerably long time period for the treatment is required to achieve the crystallization over the entire surface of a large substrate.

A laser beam capable of heating a semiconductor film is present in a wide range over an ultraviolet range to an infrared range. It is preferred to use a laser beam having a wavelength in an ultraviolet to visible range for selectively heating a semiconductor film or a semiconductor region formed on a substrate in view of the relationship with an absorption coefficient of a semiconductor. However, since a laser beam emitted from a solid laser oscillation device exhibits a strong coherence, the interference is caused on the irradiated surface. As a result, a uniform laser beam cannot be radiated.

SUMMARY OF THE INVENTION

The present invention is devised in view of the above problems, and has an object to provide a laser treatment apparatus for irradiating the position where a TFT is to be formed with a laser beam over the entire surface of a large substrate to achieve the crystallization, thereby being capable of forming a crystalline semiconductor film having a large grain diameter with high throughput.

In order to achieve the above-mentioned object, according to the present invention, there is provided a laser irradiation apparatus including: a first movable mirror for deflecting a laser beam in a main scanning direction; and an elongated second movable mirror for receiving the laser beam deflected in the main scanning direction and scanning the laser beam in a sub scanning direction, in which the second movable mirror includes means for scanning the laser beam in the sub scanning direction at a rotation angle around an axis in a longitudinal direction of the second movable mirror and irradiating an object to be treated which is placed on a stage with the laser beam.

Also, according to another structure of the present invention, there is provided a laser irradiation apparatus including: a first laser beam scanning system including a first movable mirror for deflecting a laser beam in a first main scanning direction, and an elongated second movable mirror for receiving the laser beam deflected in the first main scanning direction and scanning the laser beam in a first sub scanning direction; and a second laser beam scanning system including a third movable mirror for deflecting a laser beam in a second main scanning direction, and a fourth movable mirror for receiving the laser beam deflected in the second main scanning direction and scanning the laser beam in a second sub scanning direction, in which: the second movable mirror includes means for scanning the laser beam in the first sub scanning direction at a rotation angle round an axis in a longitudinal direction of the second movable mirror and irradiating an object to be treated which is placed on a stage with the laser beam; and the fourth movable mirror includes means for scanning the laser beam in the second sub scanning direction at a rotation angle around an axis in a longitudinal direction of the fourth movable mirror and irradiating the object to be treated which is placed on the stage with the laser beam.

In a preferable embodiment, each of the first and the third movable mirrors can be one of a galvano mirror and a polygon mirror.

As a laser for supplying a laser beam, a solid laser or a gas laser is used.

In the above structure of the invention, a laser beam is scanned in a main scanning direction with a first movable mirror and is scanned in a sub scanning direction with a second movable mirror, thereby allowing a laser beam to be radiated to an arbitrary position on an object to be treated. Moreover, a plurality of laser beam scanning means are provided so as to radiate laser beams from a biaxial direction to a surface to be formed, thereby reducing a laser treatment time period.

A laser treatment apparatus according to the present invention includes: a plurality of optical systems, each including a laser oscillation device and first deflection means for deflecting a laser beam output from the laser oscillation device in a main scanning direction; and second deflection means for receiving a plurality of laser beams which are deflected in the main scanning direction and scanning in a sub scanning direction. Here, the second deflection means has a function of scanning the plurality of laser beams in the sub scanning direction at a rotation angle around an axis in a uniaxial direction of the second deflection means and irradiating an object to be treated which is placed on a stage with the laser beams.

As the first deflection means, a movable mirror whose rotation angle can be arbitrary set is suitable. Typically, a galvano mirror can be used. As the second deflection means, an elongated movable mirror is suitable which has such an area that allows the reception of a plurality of laser beams, and which is rotatable around the axis in a longitudinal direction of the mirror. Using rotation angles of these two mirrors, laser beams irradiating the object to be treated can be radiated to an arbitrary position from the main scanning direction and the sub scanning direction. Moreover, it is possible to scan a laser beam by continuously varying the angles of the two mirrors.

Also, according to another structure of the present invention, there is provided a laser treatment apparatus including: a plurality of optical systems, each including a laser oscillation device and first deflection means for deflecting a laser beam output from the laser oscillation device in a first main scanning direction; a plurality of optical systems, each including second deflection means for receiving a plurality of laser beams which are deflected in the first main scanning direction and scanning in a first sub scanning direction and third deflection means for deflecting the laser beams output from the laser oscillation device in a second main scanning direction; and fourth deflection means for receiving the plurality of laser beams deflected in the second main scanning direction and scanning in a second sub scanning direction. Here, the second and fourth deflection means have a function of scanning the plurality of laser beams in the sub scanning directions at a rotation angle around a uniaxial direction and irradiating an object to be treated which is placed on a stage with the laser beams. With this structure, it is possible to increase the number of laser beams capable of being radiated to and scanning the object to be treated, and thus, the time period necessary for laser treatment can be reduced.

An fθ lens is provided as means for correcting a scanning speed so as to be constant regardless of an irradiation angle, in the structure of the above-described optical system. As the laser oscillation device, a gas laser oscillation device or a solid laser oscillation device is used; in particular, a laser oscillation device operable in a continuous oscillation mode is used. As a solid laser oscillation device operable in a continuous oscillation mode, a laser oscillation device using crystal such as YAG, YVO$_4$, YLF or YAl$_5$O$_{12}$ doped with Nd, Tm or Ho is used. Although a fundamental wave of an oscillation wavelength varies depending on a dopant, a laser oscillates at a wavelength of 1 to 2 μm. In order to crystallize an amorphous semiconductor film, it is preferred to use a laser beam having a wavelength falling within a visible range to an ultraviolet range and to use a second harmonic wave to a fourth harmonic wave of a fundamental wave in order that the laser beam is selectively absorbed by a semiconductor film. Typically, for crystallization of amorphous silicon, a second harmonic wave (532 nm) of an Nd:YVO$_4$ laser (fundamental wave: 1064 nm) is used. Besides the Nd:YVO$_4$ laser, a gas laser oscillation device such as an argon laser, a krypton laser or an excimer laser can be used.

Since a laser beam emitted from a solid laser oscillation device has strong coherence to cause interference on the irradiated surface, a plurality of laser beams emitted from different laser oscillation devices are superimposed on the irradiated portion as means for canceling the interference. With such a structure, not only interference is eliminated but also a substantial energy density in the irradiated portion can be increased. As alternative means, a plurality of laser beams emitted from different laser oscillation devices may be superimposed on the same optical axis on the midway of the optical system.

A laser treatment apparatus provided with a means for eliminating the interference can be achieved with a structure such that a laser treatment apparatus includes n (n=natural number) optical systems, the n-th optical system including an n-th laser oscillation device, deflection means for operating a laser beam in an n-th Y-axis direction, deflection means for scanning a laser beam in an n-th X-axis direction and an n-th fθ lens, in which n laser beams, which are converged and deflected by the n optical systems, have a structure to irradiate generally the same position of an object to be treated.

Owing to the above-mentioned structure of the laser treatment apparatus, a laser beam having a sufficiently high energy density to melt a semiconductor can be radiated without causing interference in the irradiated portion. Moreover, by scanning a laser beam with deflection means, the crystallization of an amorphous semiconductor film can be achieved over the entire surface of a large substrate.

It is not necessary to radiate a laser beam while scanning the entire surface of the object; it is sufficient to irradiate a specific region with a laser beam while specifying a place to be irradiated. The structure of the laser treatment apparatus of the present invention realizes the targeted irradiation by combining a plurality of movable mirrors. Furthermore, by superimposing the laser beams on the same irradiated portion, the effects of interference can be eliminated.

On the other hand, a method of manufacturing a semiconductor device according to the present invention for solving the above problems, includes the step of scanning a plurality of laser beams in one direction with first deflection means for deflecting the plurality of laser beams in a main scanning direction and second deflection means for scanning in a sub scanning direction, to thereby crystallize a semiconductor film having an amorphous structure formed on an insulating surface or to recover the crystallinity of a semiconductor film. A scanning direction of the laser beam is set identical with a channel length direction of a TFT to lower the probability of the generation of crystal grain boundaries traversing the channel length direction, thereby improving a carrier mobility.

As another structure, a plurality of laser beams are scanned in one direction with first deflection means for deflecting a plurality of first laser beams in a first main scanning direction, second deflection means for scanning in a first sub scanning direction, third deflection means for deflecting a plurality of second laser beams in a second main scanning direction, and fourth deflection means for scanning in a second sub scanning direction to crystallize an amorphous semiconductor film formed on an insulating surface or to recover the crystallinity of a semiconductor film.

A laser beam is output from a solid laser oscillation device in a continuous oscillation mode. In order to selectively heat a semiconductor film, it is preferred that a laser beam falls within a wavelength band having an absorption coefficient of $10^3$ cm$^{-1}$ or higher. For a semiconductor such as silicon or silicon germanium, a laser beam falling within a wavelength band of 700 nm or lower (visible range to ultraviolet range) is desirable.

A region to be irradiated with a laser beam is not required to be the entire surface of a semiconductor film; a laser beam is interruptedly radiated so as to crystallize a selected region of an amorphous semiconductor film or recover the crystallinity of the region.

With the above structure, a laser beam is radiated generally to a position where a TFT is to be formed over the entire surface of a large substrate so as to achieve the crystallization. As a result, a crystalline semiconductor film having a large grain diameter can be obtained with high throughput.

The term "amorphous semiconductor film" in the present invention includes, in a narrow sense, not only a semiconductor film having a completely amorphous structure, but also a semiconductor film containing fine crystal particles or a so-called microcrystalline semiconductor film, and a semiconductor film locally having a crystalline structure. Typically, an amorphous silicon film is used. Besides the amorphous silicon film, an amorphous silicon germanium film, an amorphous silicon carbide film and the like can also be used.

BRIEF DESCRIPTION OF THE DRAWINGS

In the accompanying drawings:

FIGS. 14(1-A) to 14(2-B) are schematic views illustrating a scanning direction of a laser beam on a semiconductor film and fabrication steps of a TFT;

FIGS. 21A to 21G are schematic views showing examples of a semiconductor device;

FIG. 23 is a schematic layout showing a mode of a laser irradiation apparatus according to the present invention;

FIGS. 25(1-A) to 25(2-B) are schematic views illustrating a scanning direction of a laser beam on a semiconductor film and fabrication steps of a TFT.

DESCRIPTION OF THE PREFERRED EMBODIMENTS

Figure 1:
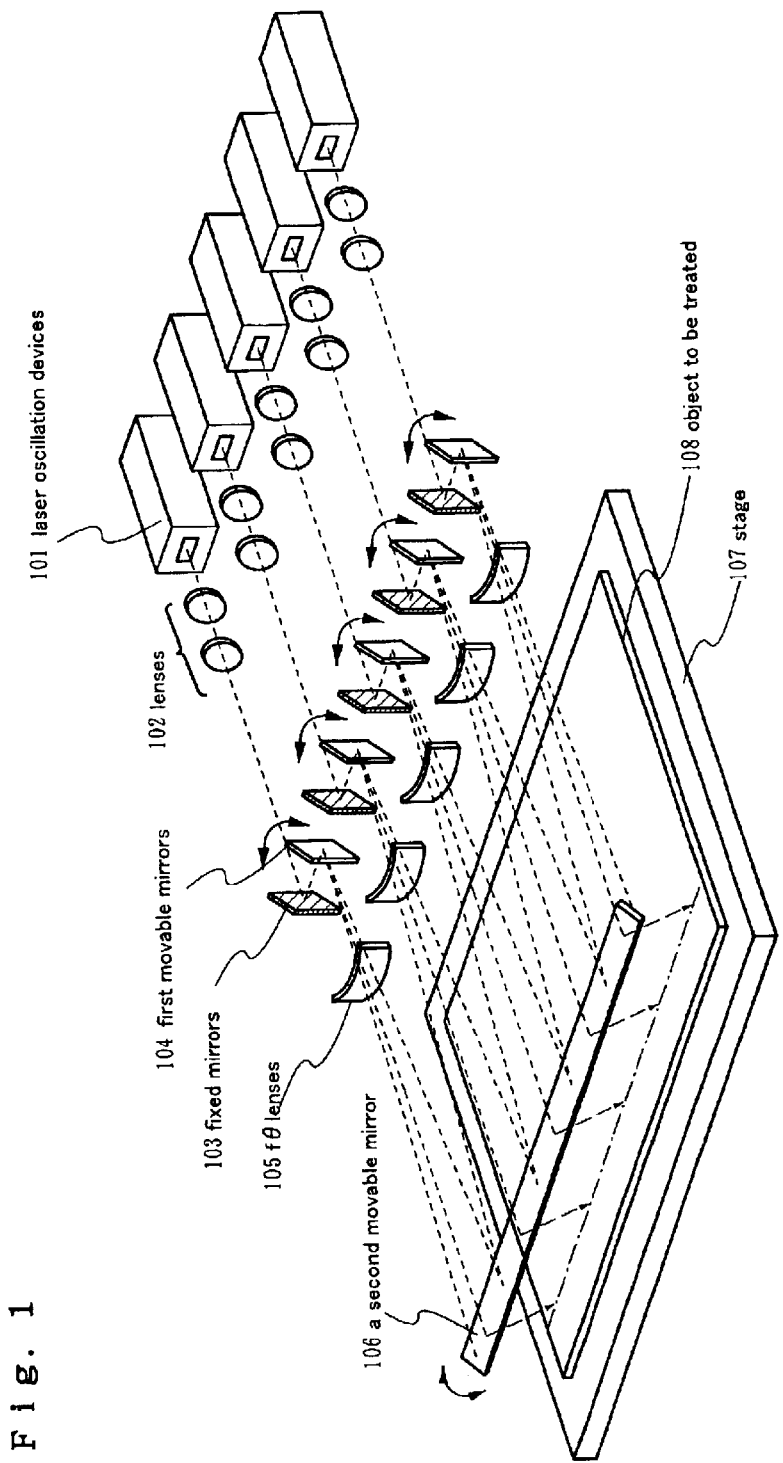
FIG. 1 is a schematic layout showing a mode of a laser irradiation apparatus according to the present invention.

Hereinafter, embodiments of the present invention will be described in detail with reference to the accompanying drawings.

[Embodiment Mode 1]

FIG. 23 shows an example of a laser treatment apparatus according to the present invention. The laser treatment apparatus shown in FIG. 23 includes: a solid laser 11 operable in a continuous oscillation mode or a pulse mode; a lens 12 for converging a laser beam such as a collimator lens or a cylindrical lens; a fixed mirror 13 for altering an optical path for a laser beam; a galvano mirror 14 for radially scanning a laser beam in a two-dimensional direction; and a movable mirror 15, for receiving a laser beam from the galvano mirror 14 and directing the laser beam toward an irradiated surface of a stage 16. The galvano mirror 14 and the movable mirror 15 are respectively rotated in a θ direction shown in FIG. 23 while crossing an optical axis of the galvano mirror 14 and that of the movable mirror 15. As a result, it is possible to scan a laser beam across the entire surface of a substrate 17 which is placed on the stage 16. The movable mirror 15 can also serve as an fθ mirror for correcting an optical path difference so as to correct a beam shape on the irradiated surface.

Figure 24:
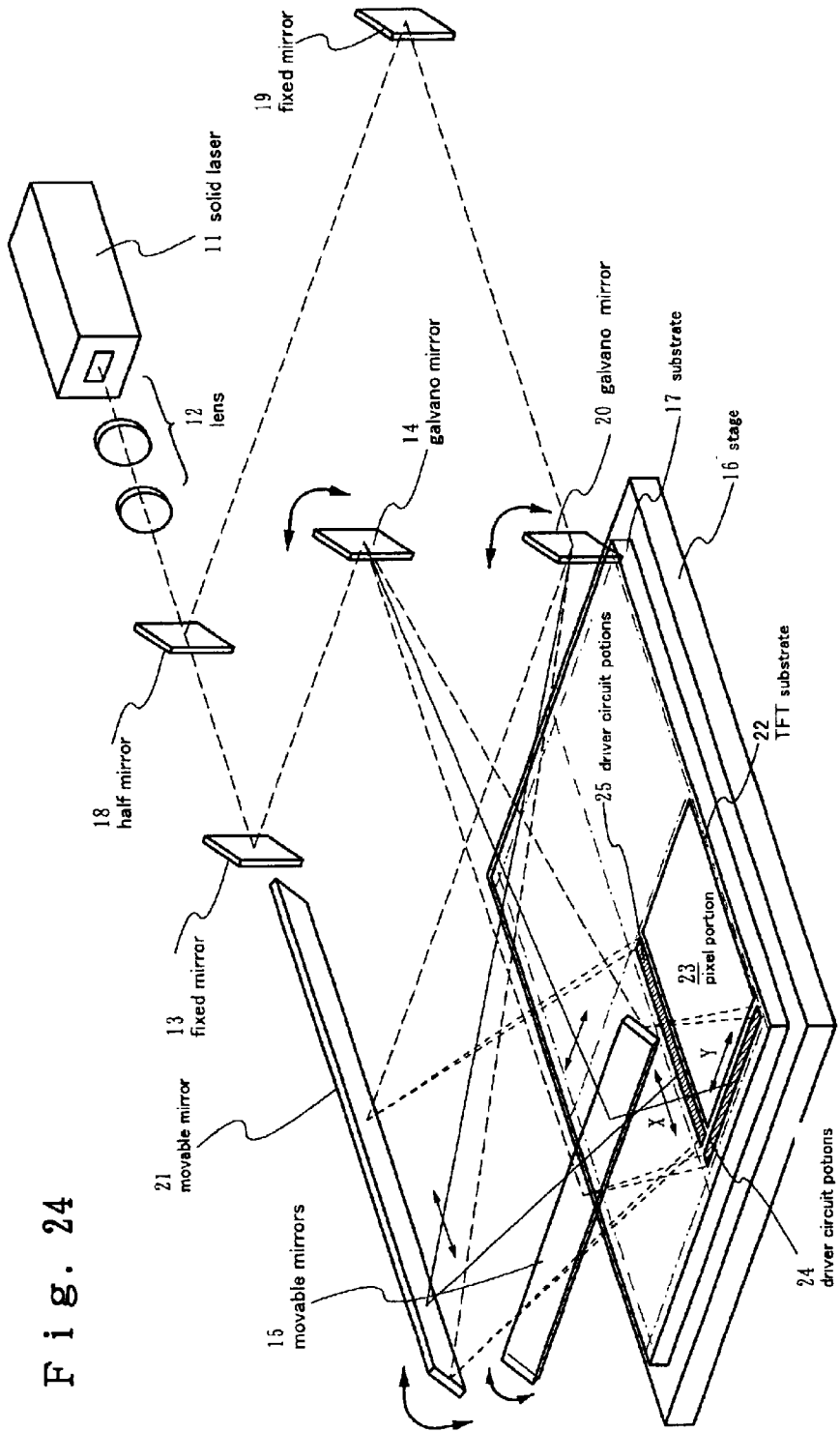
FIG. 24 is a schematic layout showing a mode of a laser irradiation apparatus according to the present invention.

FIG. 23 shows a method of scanning a laser beam in a uniaxial direction of the substrate 17 which is placed on the stage 16, with the galvano mirror 14 and the movable mirror 15. As shown in FIG. 24, as a more preferred embodiment mode, a half mirror 18, a fixed mirror 19, a galvano mirror 20 and a movable mirror 21 may be added to the structure shown in FIG. 23 so as to simultaneously scan laser beams in a biaxial direction (x and y directions). With such a structure, a treatment time period can be reduced. The galvano mirrors 14 and 20 may be replaced by polygon mirrors.

A solid laser is preferred as a laser; a laser using a crystal such as YAG, $YVO_4$, YLF and $YAl_5O_{12}$ doped with Nd, Tm or Ho is used. Although a fundamental wave of an oscillation wavelength varies depending on a dopant, a laser oscillates at a wavelength of 1 to 2 μm. In order to crystallize an amorphous semiconductor film, it is preferred to use a second harmonic wave to a fourth harmonic wave of the above oscillation wavelength so that a laser beam is selectively absorbed by a semiconductor film. Typically, for crystallization of amorphous silicon, a second harmonic wave (532 nm) of an Nd: YAG laser (fundamental wave: 1064 nm) is used.

The oscillation may be either in a pulse mode or a continuous oscillation mode. In order to continuously grow crystals while maintaining a melted state of a semiconductor film, it is desirable to select a continuous oscillation mode.

In the case where a TFT is formed of a semiconductor film crystallized by laser annealing on a substrate, a high field effect mobility can be obtained when a growth direction of crystals and a moving direction of carriers are set identical. More specifically, a field effect mobility can be substantially enhanced by setting a crystal growth direction and a channel length direction to be identical with each other.

In the case where a non-single crystalline semiconductor film is irradiated with a continuous wave laser beam so as to crystallize the semiconductor film, continuous crystal growth is made possible in a scanning direction of the laser beam because a solid/liquid interface is held. As shown in FIG. 24, on a TFT substrate 22 (substrate on which TFTs are mainly formed) on which an active matrix liquid crystal display device integrated with driver circuits is to be formed, driver circuit potions 24 and 25 are formed in the periphery of a pixel portion 23. FIG. 24 shows the form of a laser irradiation apparatus in consideration of such a layout. The laser irradiation apparatus is constituted so that laser beams are incident from a biaxial direction. With such a structure, the combination of the galvano mirrors 14 and 20 and the combination of the movable mirrors 15 and 21 permit laser beams to be radiated in an x direction and a y direction indicated with arrows in FIG. 24 in synchronous or asynchronous with each other. Namely, a laser beam can be radiated to a specified place in accordance with a layout of TFTs.

Next, with reference to FIGS. 25(1-A) to 25(2-B), the crystallization of a non-single crystalline semiconductor film and the steps of forming a TFT using the obtained crystalline semiconductor film will be described. FIG. 25(1-B) is a longitudinal cross-sectional view showing a non-single crystalline semiconductor film 53 formed on a glass substrate 51. A representative example of the non-single crystalline semiconductor film 53 is an amorphous silicon film. In addition, an amorphous silicon germanium film or the like can also be used as the non-single crystalline semiconductor film 53. Although an allowable thickness of the film 53 ranges from 10 to 200 nm, the thickness may be further increased depending on a wavelength and an energy density of a laser beam. It is desirable to provide a blocking layer 52 between the glass substrate 51 and the non-single crystalline semiconductor film 53 as a means for preventing an impurity such as an alkaline metal from being diffused from the glass substrate into the semiconductor film. A silicon nitride film or a silicon oxynitride film is used as the blocking layer 52.

The crystallization is achieved by irradiation of a laser beam 50, thereby forming a crystalline semiconductor film 54. The laser beam 50 scans, as shown in FIG. 25(1-A), in accordance with the assumed position of a semiconductor region 55 of a TFT As a beam shape, an arbitrary shape such as a rectangular, a linear or an ellipsoidal shape can be used. It is preferred that the semiconductor region 55 is not situated under the edge of the beam because a laser beam converged through an optical system does not necessarily have a constant energy intensity across the central portion and the edge.

Laser beam scanning is not limited to unidirectional scanning; two-way scanning is also possible. In such a case, a laser energy density is varied for each scanning so as to achieve the crystal growth in a gradational manner. The laser beam scanning also serves as a dehydrogenation treatment that is frequently needed for crystallizing amorphous silicon. In this case, after the first scanning is performed at a low energy density to release hydrogen, the second scanning may be performed at a higher energy density to achieve the crystallization.

Thereafter, as shown in FIGS. 25(2-A) and 25(2-B), the thus formed crystalline semiconductor film is etched to form the semiconductor region 55 which is divided in an island-like manner. In the case of a top gate TFT, a gate insulating film 56, a gate electrode 57 and a one-conductivity type impurity region 58 are formed on the semiconductor region 55 to complete a TFT. Thereafter, a wiring, an interlayer insulating film or the like may be formed as the need arises.

In such an irradiation method of a laser beam, a continuous wave laser beam is radiated to allow the growth of crystals having a large grain diameter. Certainly, it is necessary to appropriately set particular parameters such as a scanning speed and an energy density of a laser beam. The growth of crystals having a large grain diameter can be realized by setting a scanning speed to 10 to 80 cm/sec. It is said that a crystal growth speed using a pulse laser after melt-solidification is 1 m/sec. The continuous crystal growth at the solid/liquid interface is allowed by scanning a laser beam at a lower speed than the above crystal growth speed and slow cooling, thereby realizing an increased grain diameter of crystals.

The laser irradiation apparatus of the present invention allows the crystallization by laser beam irradiation while specifying an arbitrary position on the substrate under such a condition. With laser beam irradiation from a biaxial direction, a throughput can be further improved.

[Embodiment Mode 2]

FIG. 1 shows a laser treatment apparatus according to the present invention, illustrating an example of a structure using a plurality of laser oscillation devices. The laser treatment apparatus shown in FIG. 1 allows the simultaneous radiation of a plurality of laser beams to an object to be treated (hereinafter, referred to simply as object) while scanning the laser beams.

The laser treatment apparatus shown in FIG. 1 includes: a plurality of laser oscillation devices 101 operable in a continuous oscillation mode or a pulse mode; lenses 102 for converging a laser beam, such as collimator lenses or cylindrical lenses; fixed mirrors 103 for altering an optical path for a laser beam; first movable mirrors 104 for radially scanning a laser beam in a two-dimensional direction; and fθ lenses 105 for keeping a scanning speed constant in the case of laser beam scanning. For convenience, these structures are collectively regarded as one optical system. The laser treatment apparatus shown in FIG. 1 has a structure in which five such optical systems are arranged. It is apparent that the number of optical systems is not limited; any number of optical systems may be used as long as the laser treatment apparatus is provided with a means for supplying a plurality of laser beams.

Furthermore, there is provided a second movable mirror 106 for receiving a plurality of laser beams supplied from a plurality of optical systems and deflecting the laser beams toward an object to be treated 108 on a stage 107. In order to scan a laser beam in a main scanning direction and a sub scanning direction, an optical axis of the first movable mirror 104 and that of the second movable mirror 106 are crossed. With such a structure, it is possible to scan a laser beam across the entire surface of the object 108 which is placed on the stage 107. The first movable mirrors 104 and the second movable mirror 106 in this structure are used as deflection means.

If the laser beam incident on the object is reflected on its surface to reenter the optical system, there arises a problem that the laser oscillation device may be damaged. Therefore, it is desirable that the laser beam is incident on the object at a predetermined angle.

In this embodiment mode, there is shown a structure in which the optical system is provided with the fθ lens 105. Alternatively, the second movable mirror 106 may be replaced by an fθ mirror for correcting an optical path difference so as to correct a beam shape on the irradiated surface.

A preferred laser oscillation device is a solid laser oscillation device; a laser oscillation device using a crystal such as YAG, YVO$_4$, YLF and YAl$_5$O$_{12}$ doped with Nd, Tm or Ho is used. Although a fundamental wave of an oscillation wavelength varies depending on a dopant, a laser oscillates at a wavelength of 1 to 2 μm. In order to crystallize a non-single crystalline semiconductor film, it is preferred to use a second harmonic wave to a fourth harmonic wave of the above oscillation wavelength so that a laser beam is selectively absorbed by a semiconductor film. Typically, for crystallization of amorphous silicon, a second harmonic wave (532 nm) of an Nd: YAG laser (fundamental wave: 1064 nm) is used. Besides the Nd: YAG laser, a gas laser oscillation device such as an argon laser, a krypton laser or an excimer laser can also be used. The oscillation may be either in a pulse mode or a continuous oscillation mode. However, in order to achieve the continuous crystal growth while keeping a semiconductor film in a melted state, it is desirable to select a continuous oscillation mode.

A fundamental wave can be converted into a second harmonic wave, a third harmonic wave and a fourth harmonic wave through a wavelength converter including a non-linear element. A wavelength converter may be integrated into a part of the above-mentioned optical system or into the laser oscillation device itself. In the laser oscillation device 101 shown in FIG. 1, it is considered that a wavelength converter is integrated in the laser oscillation device 101 itself.

Figure 2:
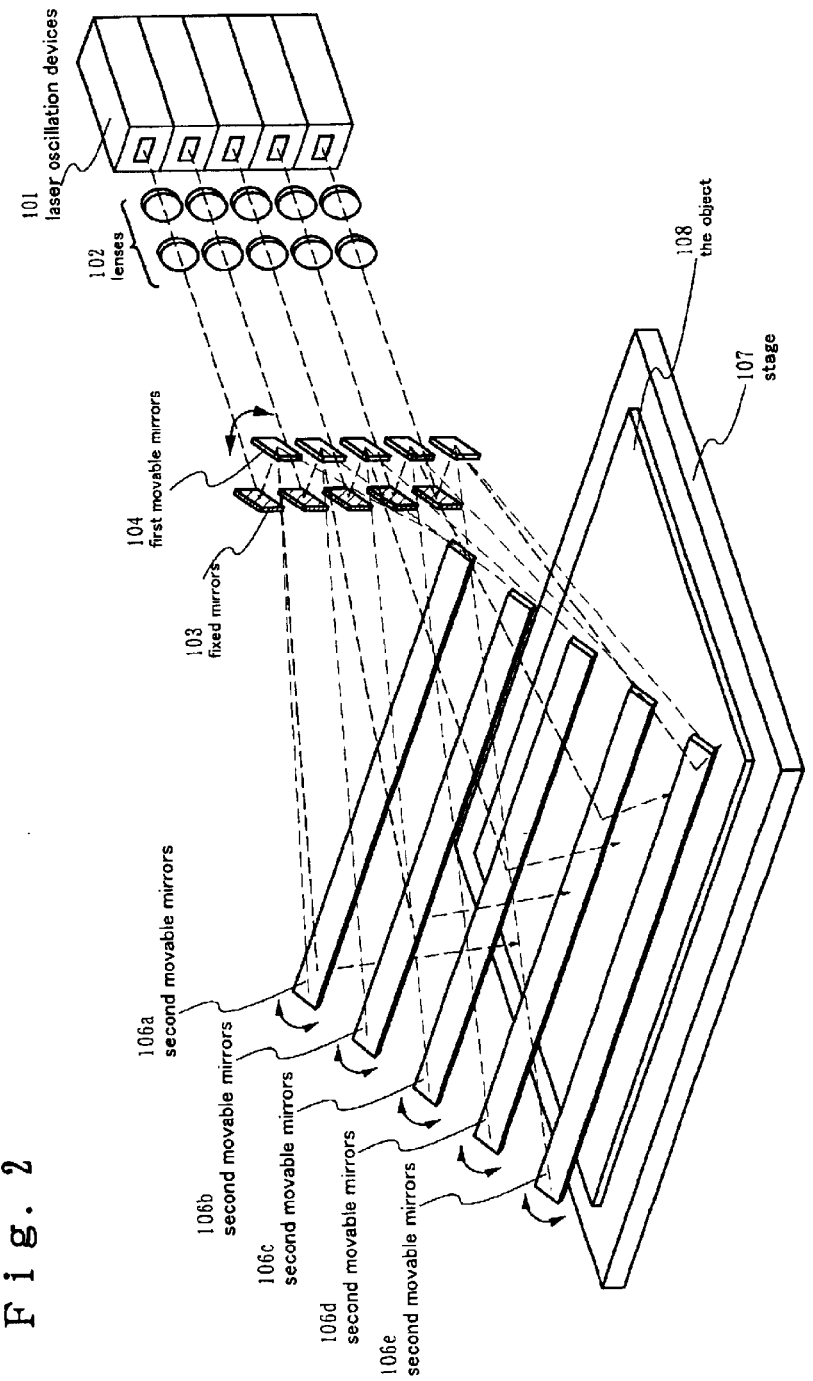
FIG. 2 is a schematic layout showing a mode of a laser irradiation apparatus according to the present invention.
Figure 3:
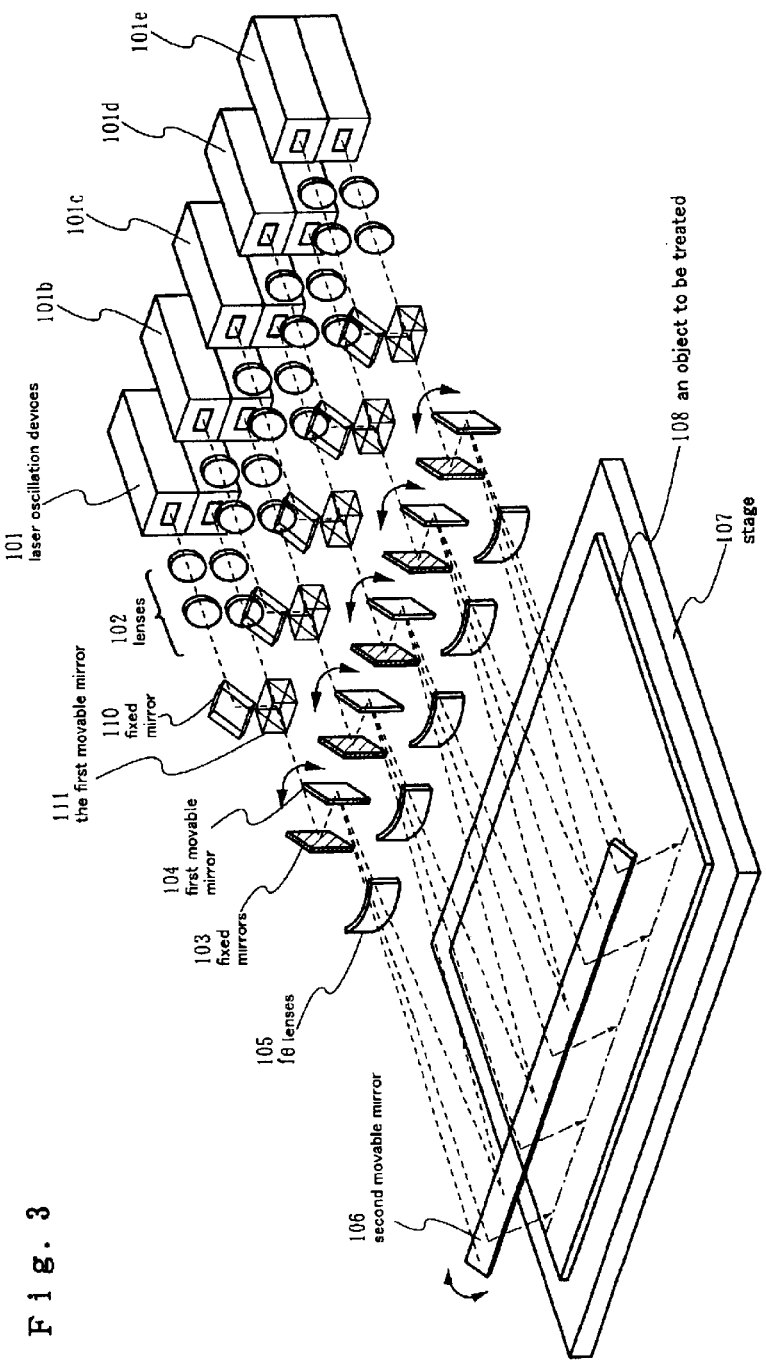
FIG. 3 is a schematic layout showing a mode of a laser irradiation apparatus according to the present invention.

In the structure of a laser treatment apparatus shown in FIG. 2, similarly to FIG. 1, a plurality of optical systems are provided, each including: the laser oscillation device 101 operable in a continuous wave or a pulse; the lens 102 for converging a laser beam, such as a collimator lens or a cylindrical lens; the fixed mirror 103 for altering an optical path for a laser beam; and the first movable mirror 104 for radially scanning a laser beam in a two-dimensional direction. In addition, a plurality of elongated second movable mirrors 106 are provided so as to correspond to the plurality of optical systems. Also in this structure, a laser beam can be scanned across the entire surface of the object 108 which is placed on the stage 107. The laser treatment apparatus may be additionally provided with an fθ lens or an fθ mirror, The structure of a laser treatment apparatus shown in FIG. 3 is as follows: after a plurality of laser beams are synthesized to obtain a single laser beam by using fixed mirrors 110 and prisms 111 while using a plurality of laser oscillation devices 101 with respect to one optical system, the obtained laser beam is made incident on the fixed mirrors 103. Laser beams having different phases, which are emitted from different laser oscillation devices, are synthesized, thereby restraining the generation of a distribution in energy density in the irradiated region due to interference. The remaining structure is similar to that shown in FIG. 1. The laser treatment apparatus includes the lenses 102, the fixed mirrors 103, the first movable mirrors 104, the fθ lenses 105 and the second movable mirror 106. The object 108 to be treated is placed on the stage 107.

Figure 4:
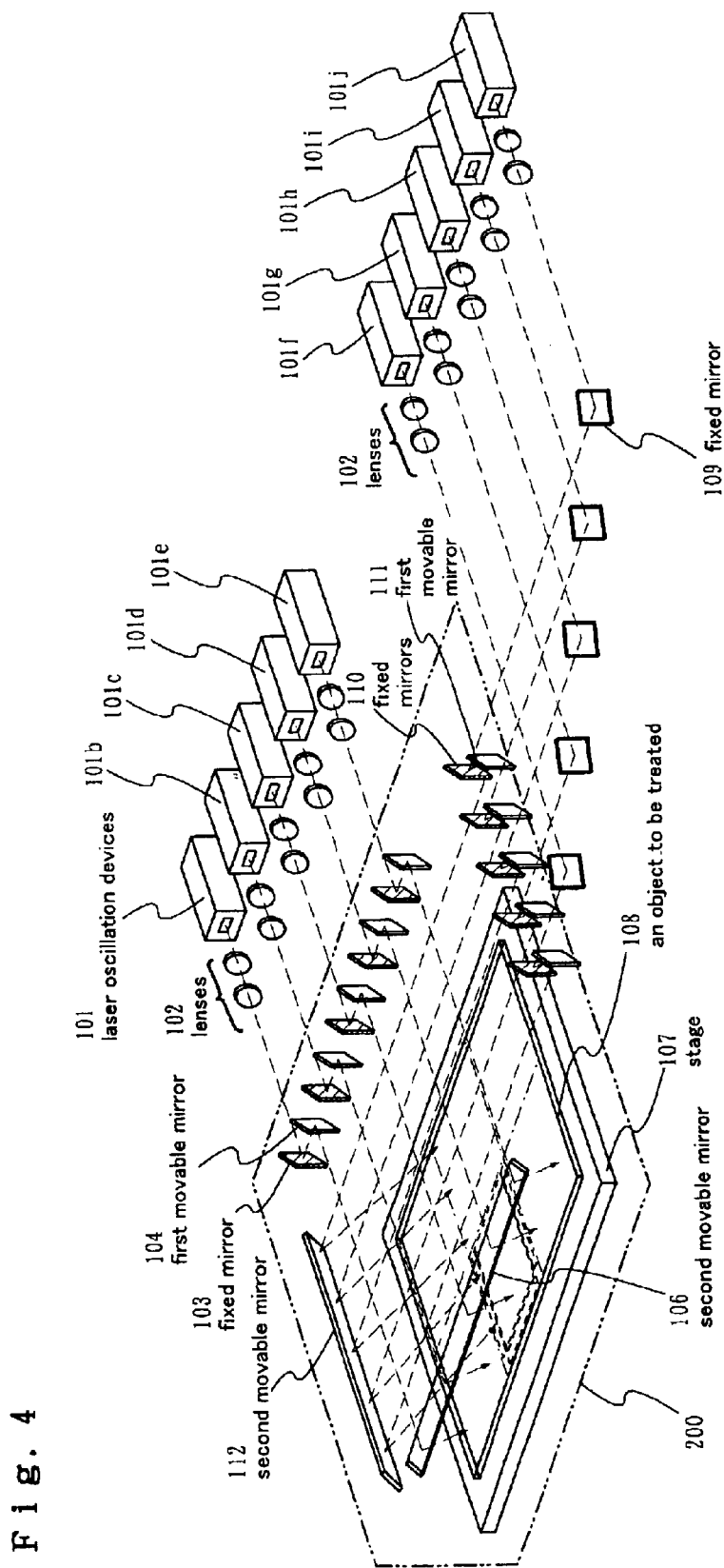
FIG. 4 is a schematic layout showing a mode of a laser irradiation apparatus according to the present invention.

FIG. 4 shows the structure in which a plurality of laser beams supplied from a plurality of optical systems are radiated from two different directions, as an embodiment mode of another laser treatment apparatus. In the structure shown in FIG. 4, there are provided: a plurality of optical systems, each including the laser oscillation device 101, the lens 102, the fixed mirror 103, and the first movable mirror 104; a path for radiating a plurality of laser beams to the object 108 on the stage 107 by means of the second movable mirror 106; a plurality of optical systems, each including the laser oscillation device 101, the fixed mirror 109, the lens 102, the fixed mirror 110, and the first movable mirror 111;

and a path for radiating a plurality of laser beams to the object 108 on the stage 107 by means of a second movable mirror 112. By simultaneously operating both optical systems, a treatment time period can be intended to be further reduced.

In the case where a TFT is formed of a crystalline semiconductor film that is crystallized by laser annealing on a substrate, a high field effect mobility can be obtained when a growth direction of crystals and a moving direction of carriers are set identical with each other. More specifically, a field effect mobility can be substantially enhanced by setting a crystal growth direction and a channel length direction to be identical with each other. In the case where a non-single crystalline semiconductor film is irradiated with a continuous wave laser beam so as to crystallize the semiconductor film, continuous crystal growth is allowed in a scanning direction of a laser beam because a solid/liquid interface is held.

The structure of an active matrix display device using a TFT can be considered to be divided into a pixel portion and a driver circuit potion, in terms of function. For a TFT manufactured using a crystalline semiconductor film, it is possible to integrally form the pixel portion and the driver circuit potion on the same substrate. Herein, a substrate on which the pixel portion and the driver circuit potion are integrally formed is referred to as a TFT substrate. In the production process, a method of forming a plurality of TFT substrates on a large glass substrate (referred to as a mother glass) and cutting the mother glass to obtain individual TFT substrates in the final stage of the process, is carried out.

Figure 5:
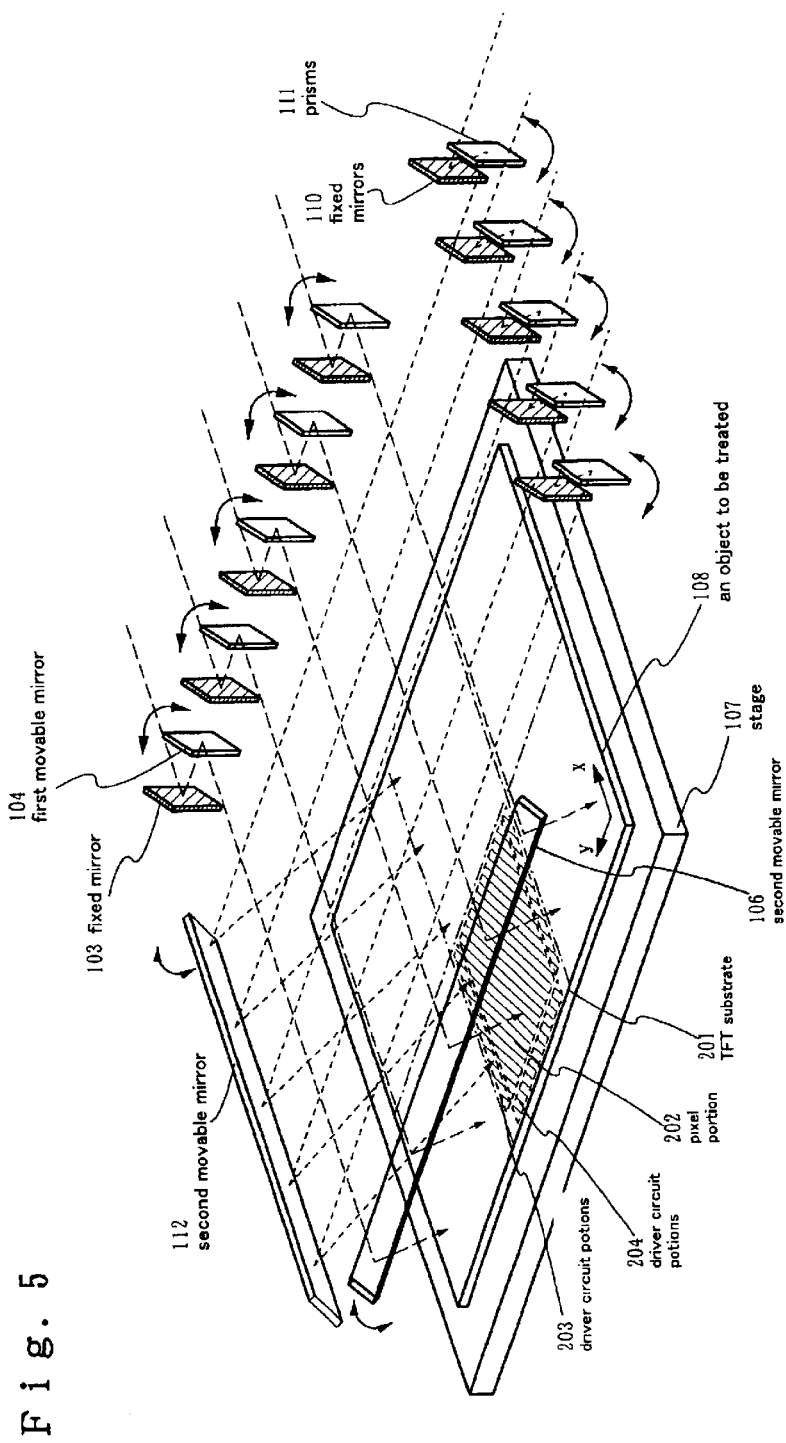
FIG. 5 is a schematic layout showing a mode of a laser irradiation apparatus according to the present invention.

A region surrounded by a two-dot chain line in FIG. 4 is shown in detail in FIG. 5. As shown in FIG. 5, on a TFT substrate 201 for forming an active matrix display device integrated with a driver circuit in the object 108 (mother glass), driver circuit potions 203 and 204 are provided in the periphery of a pixel portion 202. As illustrated in FIG. 4, in the structure for radiating laser beams from two directions, the combination of the first movable mirror 104 and the second movable mirror 106 and the combination of the first movable mirror 111 and the second movable mirror 112 allow laser beams to be synchronously or asynchronously radiated in x and y directions in FIG. 5. Therefore, a laser beam can be radiated to a specified position in accordance with the layout of a TFT.

With the above structure of the laser treatment apparatus, a laser beam, which has a sufficiently high energy density to melt a semiconductor, can be radiated without causing interference in the irradiated portion. Moreover, the crystallization of the amorphous semiconductor film can be achieved over the entire surface of a large substrate by scanning a laser beam with a deflection means. It is not necessary to radiate a laser beam by scanning the entire surface of the object; it is sufficient to radiate a specific region while specifying a place to be irradiated. The structure of the laser treatment apparatus realizes the targeted irradiation by combining a plurality of movable mirrors. Furthermore, by superimposing the laser beams on the same irradiated portion, the effects of interference can be eliminated.

[Embodiment Mode 3]

Figure 9:
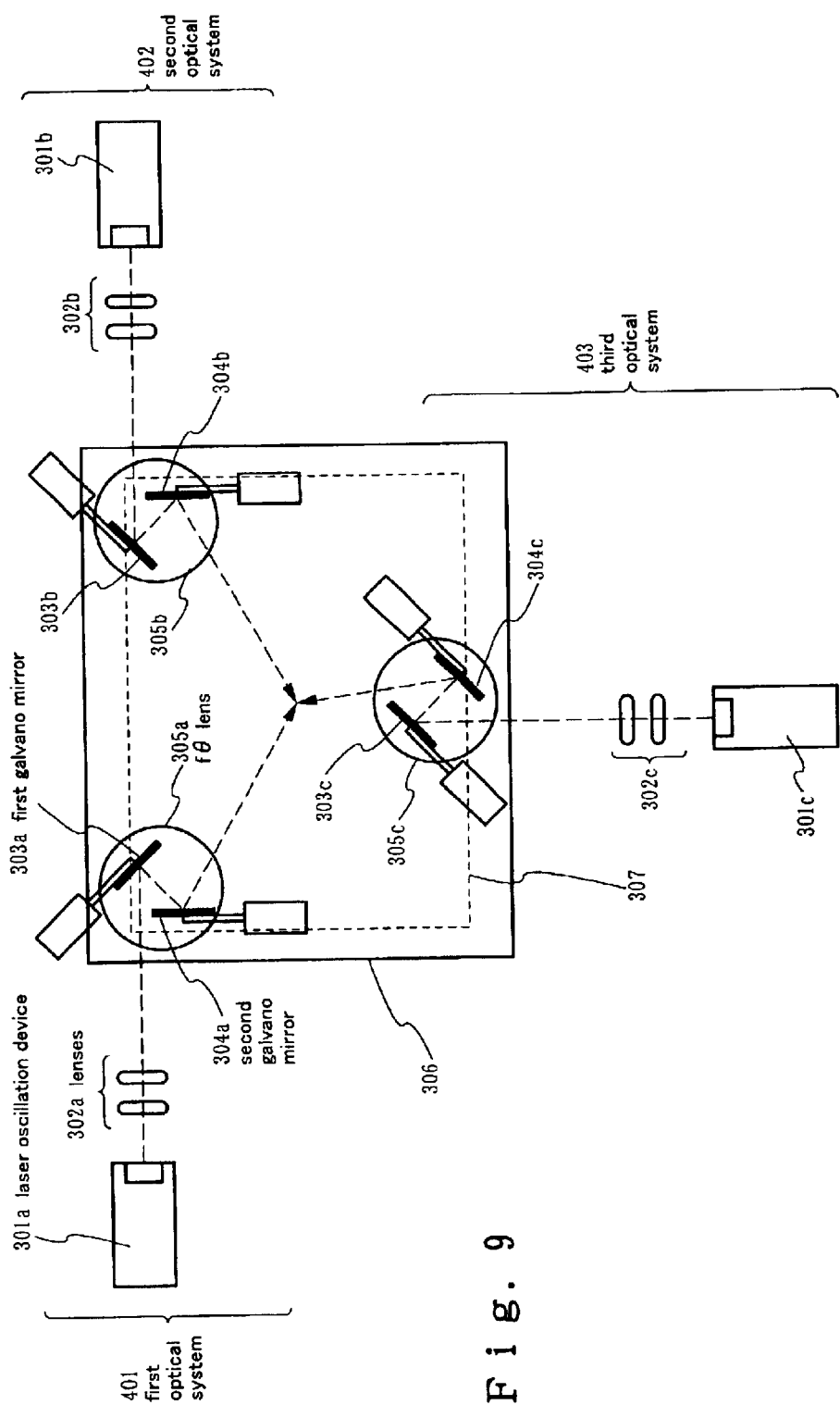
FIG. 9 is a schematic layout showing a mode of a laser irradiation apparatus according to the present invention.
Figure 10:
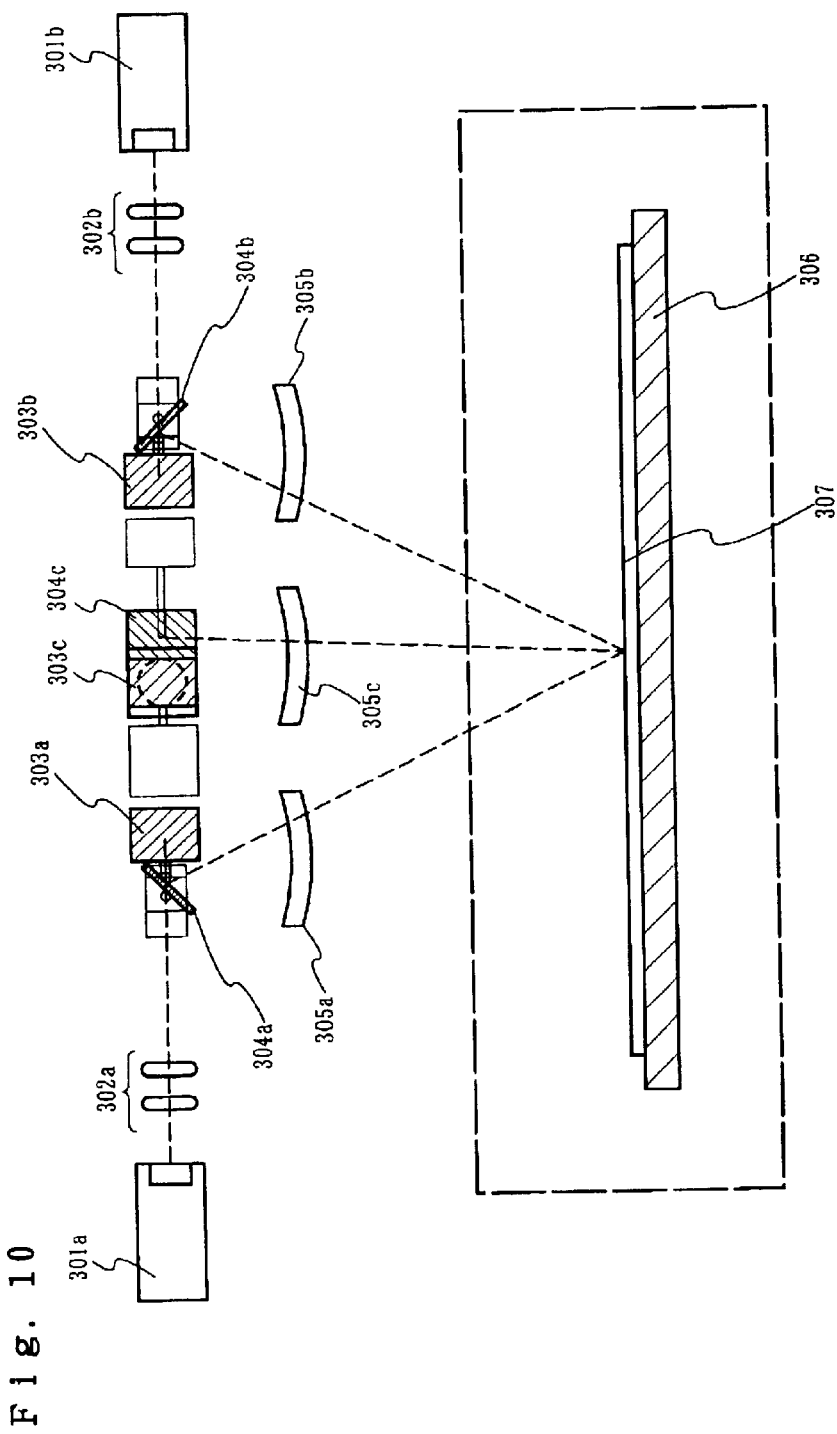
FIG. 10 is a schematic layout showing a mode of a laser irradiation apparatus according to the present invention.

A structure, which allows laser beams to be superimposed on an irradiated surface to obtain an energy density required for a laser treatment and to eliminate the interference of light, will be described with reference to FIGS. 9 and 10. FIG. 9 is a top plan view showing the structure of such a laser treatment apparatus, and FIG. 10 is a corresponding cross-sectional view for illustrating the same structure from a different angle. For convenience of description, the same reference symbols are used in FIGS. 9 and 10.

A first optical system 401 includes: a laser oscillation device 301a; a group of lenses 302a; a first galvano mirror 303a; a second galvano mirror 304a; and an fθ lens 305a. Herein, the first galvano mirror 303a and the second galvano mirror 304a are provided as deflection means.

A second optical system 402 and a third optical system 403 are similarly constituted. The deflecting direction of a laser beam is controlled by rotation angles of the first galvano mirror 303a and the second galvano mirror 304a, so that the laser beam is radiated to an object 307 to be treated on a stage 306. A beam can be shaped into an arbitrary form by the group of lenses 302 and, if necessary, by providing a slit and the like. The beam shape may be a circular, an ellipsoid, or a rectangular having a diameter of about several tens to several hundreds of μm. In principle, the stage 306 is fixed. However, since it is possible to synchronize the movement of the stage 306 with laser beam scanning, the stage 306 may be movable in the XYθ directions.

Then, laser beams radiated to the object by the first to third optical systems can be superimposed on one another to obtain an energy density required for a laser treatment and to eliminate the interference of light. Since the laser beams emitted from different laser oscillation devices have respectively different phases, the interference can be reduced by superimposing the laser beams on one another.

Although there is shown the structure in which three laser beams emitted from the first to the third optical systems are superimposed on each other, the number of laser beams is not limited to three to obtain the similar effects. The object can be achieved by superimposing a plurality of laser beams on one another.

[Embodiment Mode 4]

Figure 11A:
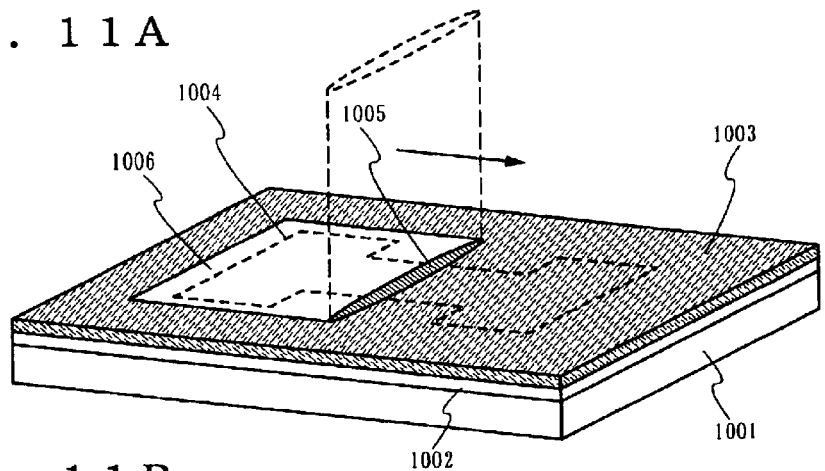
FIGS. 11A to 11C are schematic views illustrating the structure of a TFT substrate, and the relationship between the arrangement of a semiconductor region constituting a TFT and a scanning direction of a laser beam.
Figure 11B:
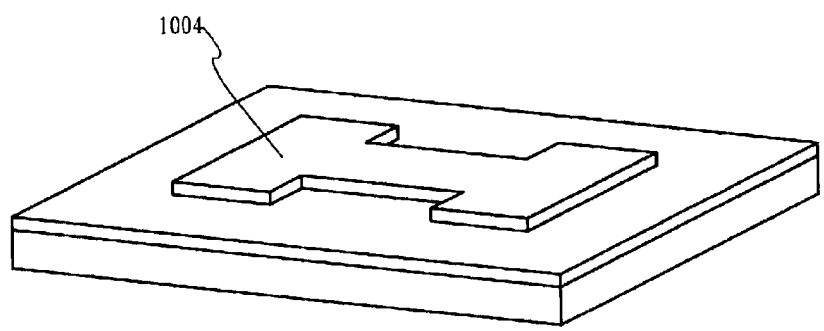
Figure 11C:
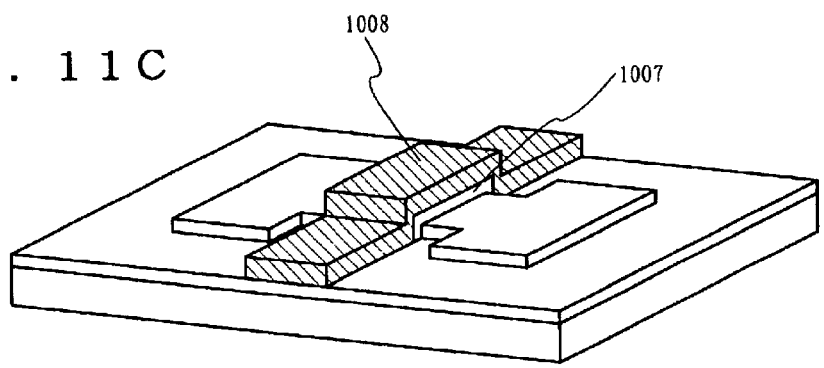

A laser treatment apparatus of the present invention is applicable to crystallize an amorphous semiconductor film, to recover the crystallinity of an ion implanted region, and to activate an impurity for controlling valence electrons. FIGS. 11A to 11C are schematic diagrams for illustrating a laser treatment process in crystallization of an amorphous semiconductor film.

In FIG. 11A, a blocking layer 1002 and an amorphous semiconductor film 1003 are formed on a substrate 1001. An irradiating portion 1005 of a laser beam may irradiate the position so as to include a semiconductor region 1004 for forming a TFT The irradiating portion 1005 scans a region larger than the semiconductor region 1004 so as to crystallize the area including the peripheral portion of the semiconductor region 1004. However, it is not necessary to crystallize the entire surface of the amorphous semiconductor film 1003.

The crystallization of the amorphous semiconductor film causes the release of contained hydrogen or the densification due to rearrangement of atoms, thereby producing the shrinkage in volume. Therefore, the continuity of lattices is not ensured at the boundary between an amorphous region and a crystal region, whereby a strain is generated. Inclusion of the semiconductor region 1004 of a TFT within a crystallized region 1006 as shown in FIG. 11A also serves to eliminate the strained region.

After a laser treatment, an unnecessary portion of the amorphous semiconductor film 1003 and the crystallized region 1006 is removed by etching so as to form the semiconductor region 1004, as shown in FIG. 11B. Thereafter, a gate insulating film 1007 and a gate electrode 1008 are formed as shown in FIG. 11C. A source region and a drain region are formed in the semiconductor region. Then, a necessary wiring is provided, thereby completing a TFT.

Figure 12:
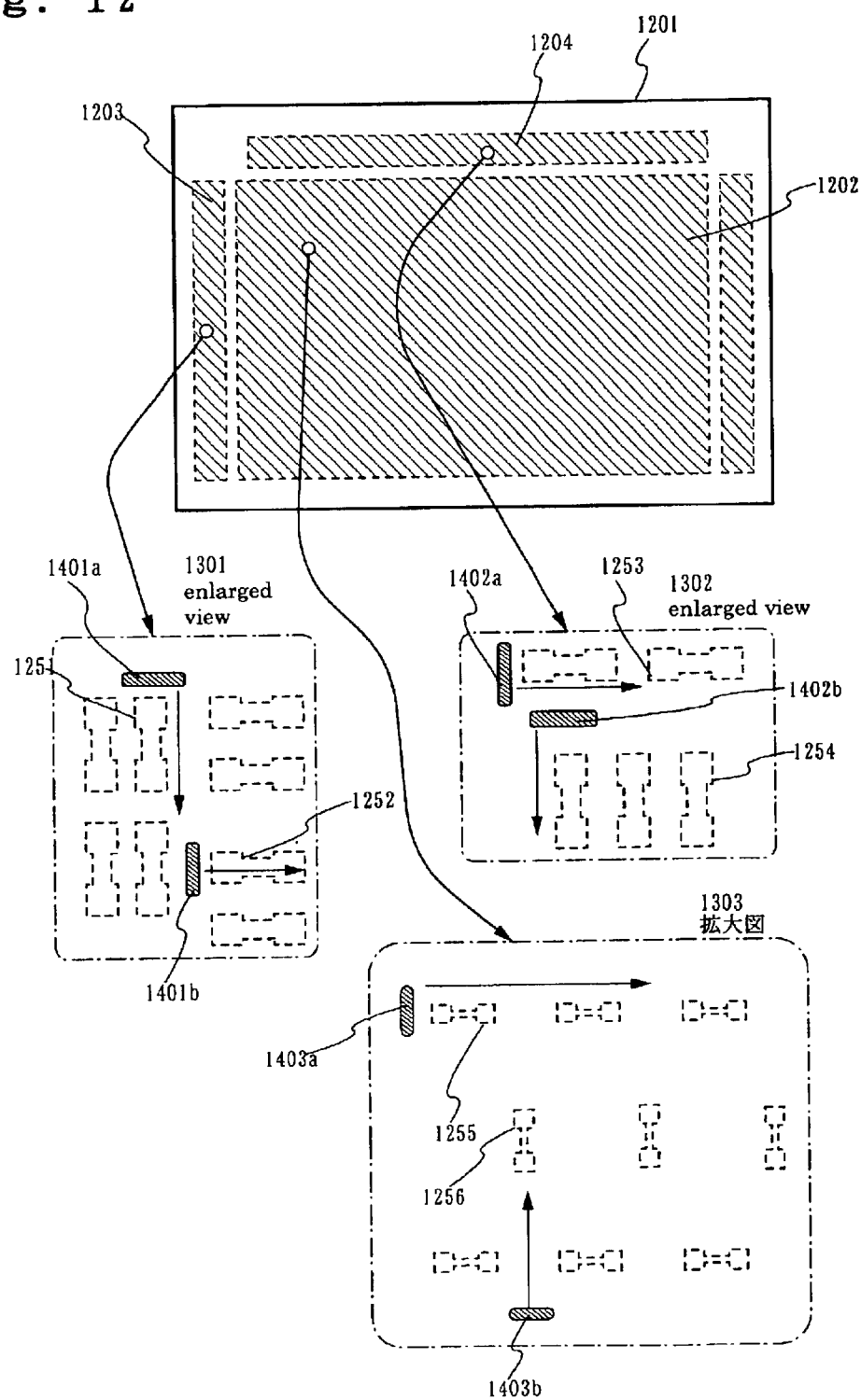
FIG. 12 is a schematic view illustrating the structure of a TFT substrate, and the relationship between the arrangement of a semiconductor region constituting a TFT and a scanning direction of a laser beam.

The structure of an active matrix display device using a TFT can be considered to be divided into a pixel portion and a driver circuit potion, in terms of function. For a TFT manufactured using a crystalline semiconductor film, it is possible to integrally form the pixel portion and the driver circuit potion on the same substrate. FIG. 12 shows in detail the relationship between a TFT substrate 1201 and an irradiation direction of a laser beam. On the TFT substrate 1201, regions where a pixel portion 1202 and driver circuit potions 1203 and 1204 are formed are indicated with a dot line. At the crystallization stage, a non-single crystalline semiconductor film is formed on the entire surface. A semiconductor region for forming a TFT can be specified with an alignment marker formed on the edge of the substrate and the like.

For example, the driver circuit potion 1203 is a region for forming a scanning line driver circuit. In a partially enlarged view 1301 of the driver circuit potion 1203, semiconductor regions 1251 and 1252 and scanning directions of laser beams 1401a and 1401b are shown. The shapes of the semiconductor regions 1251 and 1252 can be arbitrary. In any case, a channel length direction and a scanning direction of the laser beam 1401a are set identical with each other. Specifically, a scanning direction of the laser beam 1401a for the semiconductor region 1251 differs from a scanning direction of the laser beam 1401b for the semiconductor region 1252 even in the same driver circuit potion.

The driver circuit potion 1204, which is provided in such a direction to cross the driver circuit potion 1203, is a region for forming a data line driver circuit. The direction in which the semiconductor regions 1253 and 1254 are arranged and the scanning directions of laser beams 1402a and 1402b are made identical with each other (in an enlarged view 1302). The same principle applies to the pixel portion 1202. As shown in an enlarged view 1303, laser beams 1403a and 1403b are scanned in the same direction as a channel length direction with respect to the arrangement of the semiconductor regions 1255 and 1256. In the arrangement of the semiconductor regions 1255 and 1256 shown in the enlarged view 1303, the arrangement of pixels may be a delta arrangement.

Figure 13:
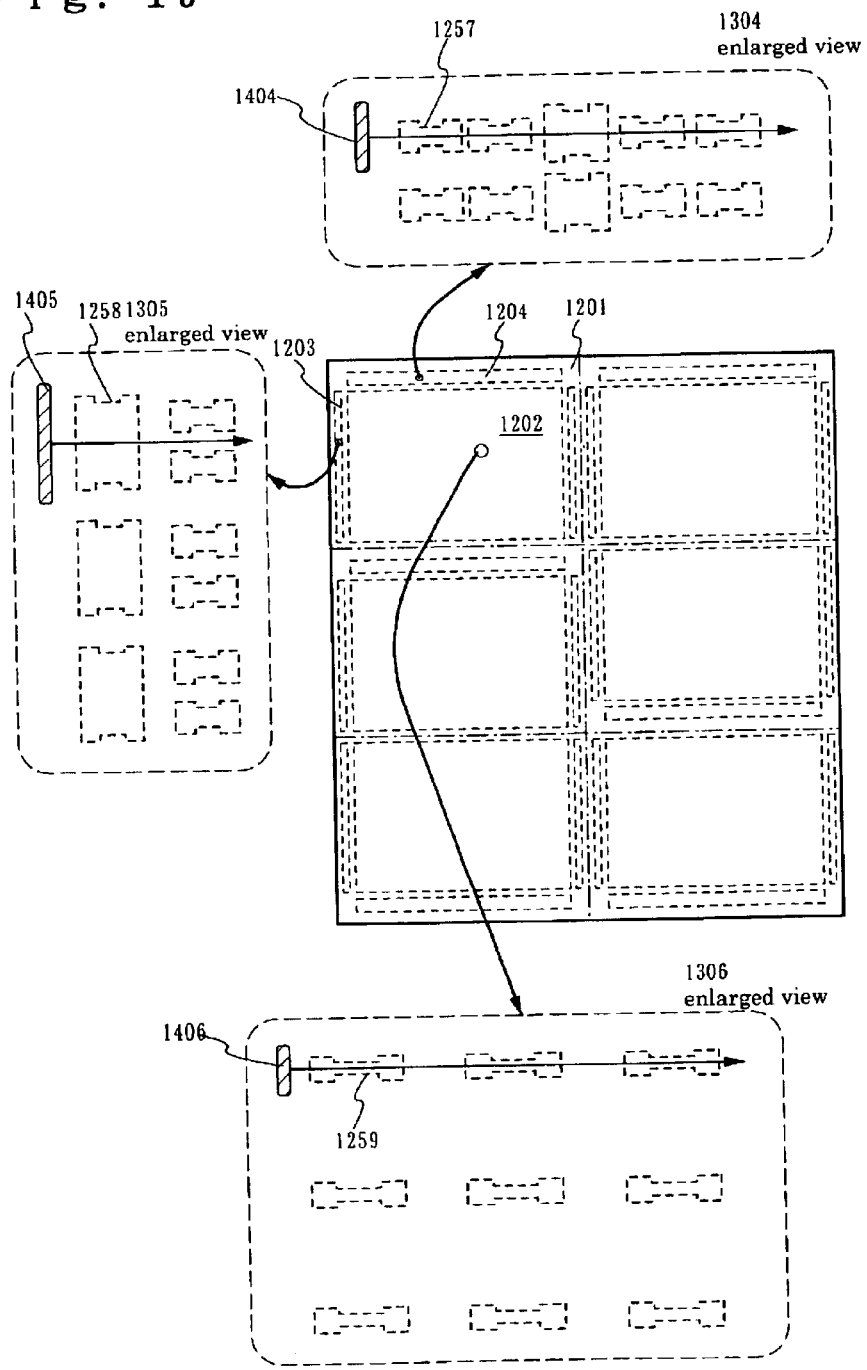
FIG. 13 is a schematic view illustrating the structure of a TFT substrate, and the relationship between the arrangement of a semiconductor region constituting a TFT and a scanning direction of a laser beam.

On the other hand, as shown in FIG. 13, the semiconductor regions formed on the semiconductor substrate 1201 may be arranged in the same direction for all areas, i.e., the pixel portion 1202, and the driver circuit potions 1203 and 1204. The arrangement of a semiconductor region 1258 and a scanning direction of a laser beam 1405 in an enlarged view 1305, the arrangement of a semiconductor region 1257 and a scanning direction of a laser beam 1404 in an enlarged view 1304, and the arrangement of a semiconductor region 1259 and a scanning direction of a laser beam 1406 in an enlarged view 1306 in FIG. 13 are set to the same direction. With this arrangement, since it is sufficient to scan all the laser beams in the same direction, a treatment time period can be further reduced.

In such a laser beam irradiation method, a continuous wave laser beam is radiated so as to allow the growth of crystals having a large grain diameter. Certainly, it is necessary to appropriately set particular parameters such as a scanning speed and an energy density of a laser beam to achieve such crystal growth; it can be realized by setting a scanning speed to 10 to 80 cm/sec. It is said that a crystal growth speed using a pulse laser after melt-solidification is 1 m/sec. The continuous crystal growth at the solid/liquid interface is allowed by scanning a laser beam at a lower speed than the above crystal growth speed and slow cooling, thereby realizing an increased grain diameter of crystal.

A scanning direction of the laser beam is not limited to one direction; two-way scanning may also be possible. Such laser beam scanning can be carried out in a laser treatment apparatus having the structures described in Embodiment Modes 1 and 2. The laser treatment apparatus of the present invention allows the crystallization by means of laser beam irradiation while specifying an arbitrary position on the substrate. By radiating a plurality of laser beams from a biaxial direction, a throughput can be further improved.

[Embodiment 1]

Figure 6:
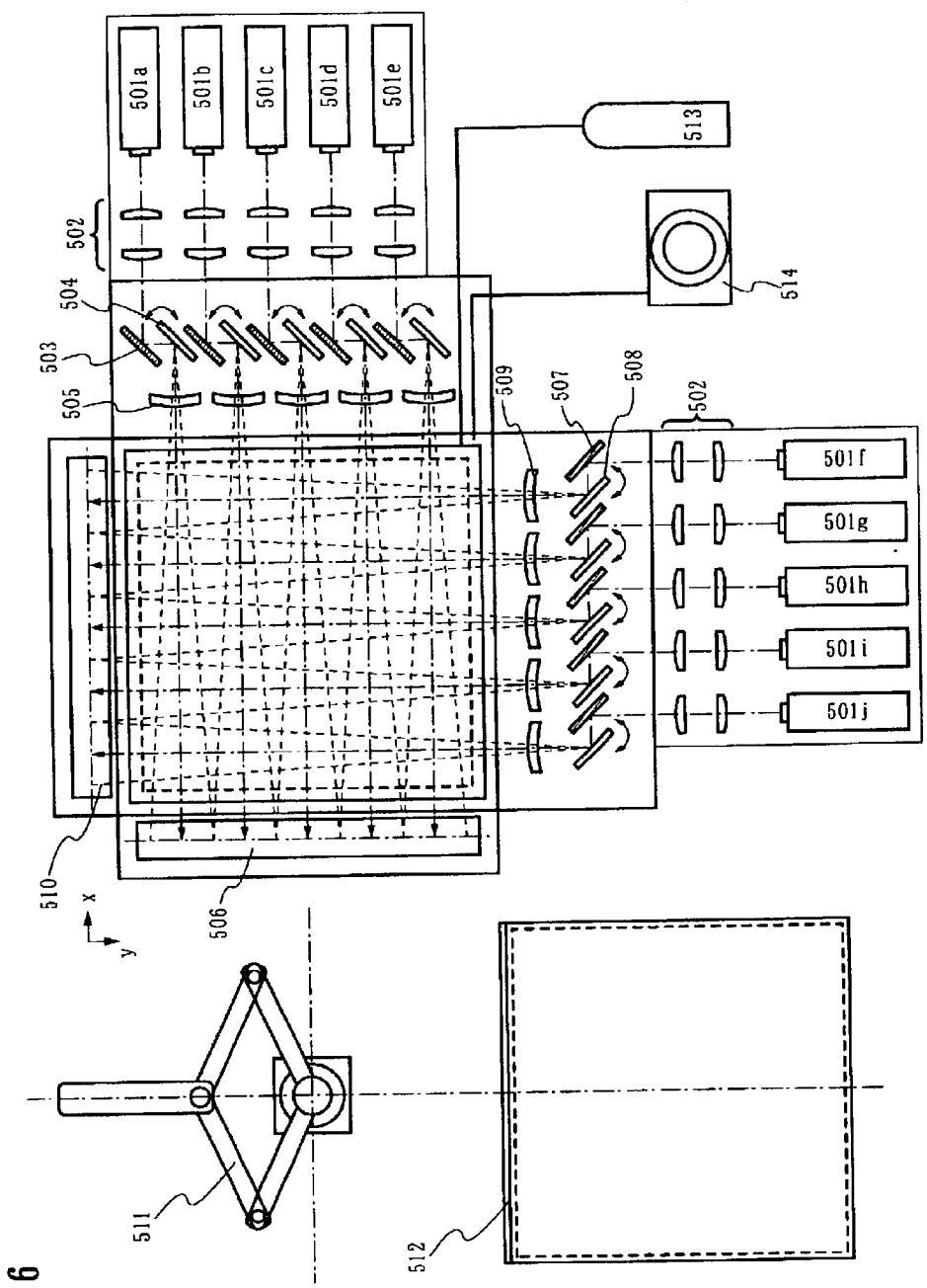
FIG. 6 is a schematic layout showing a mode of a laser irradiation apparatus according to the present invention.
Figures 7A, 7B:
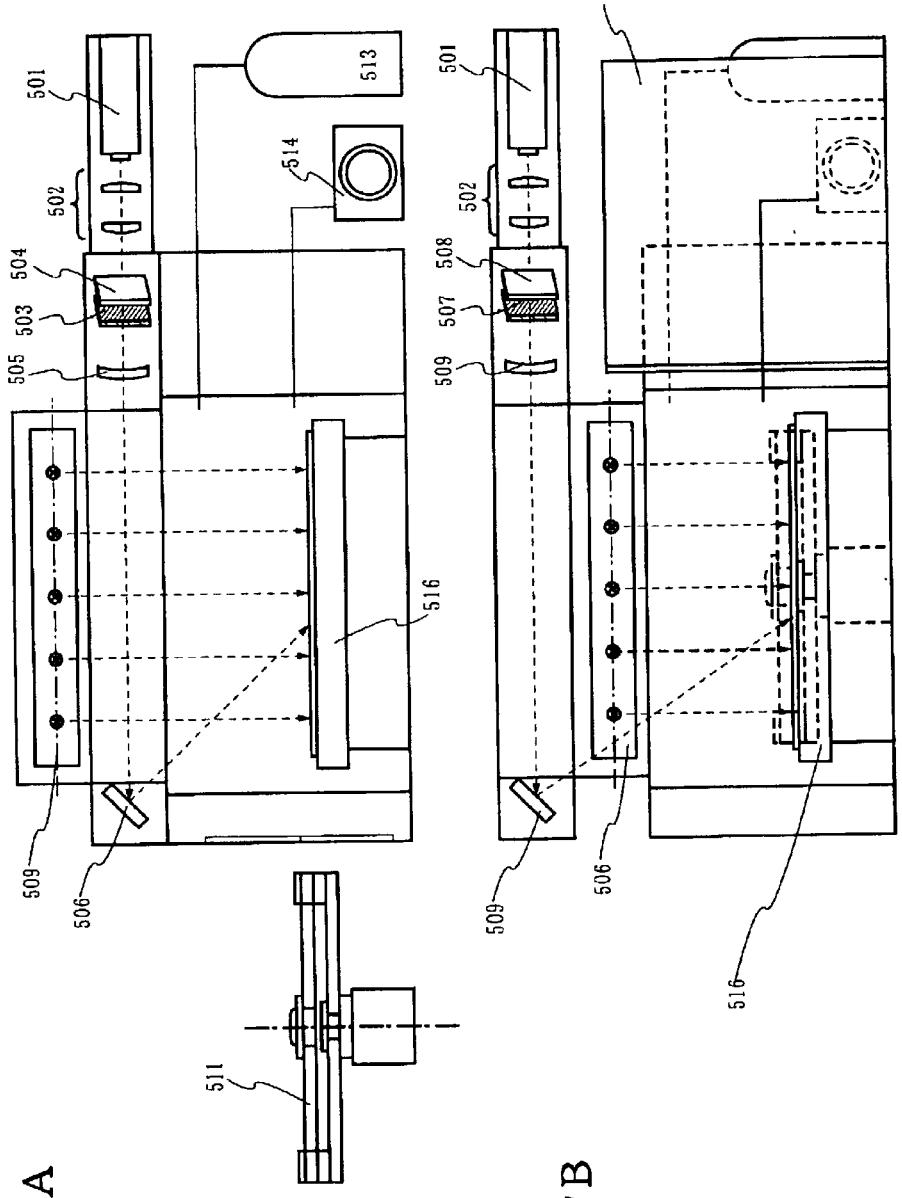
FIGS. 7A and 7B are schematic layouts showing a mode of a laser irradiation apparatus according to the present invention.
Figure 8:
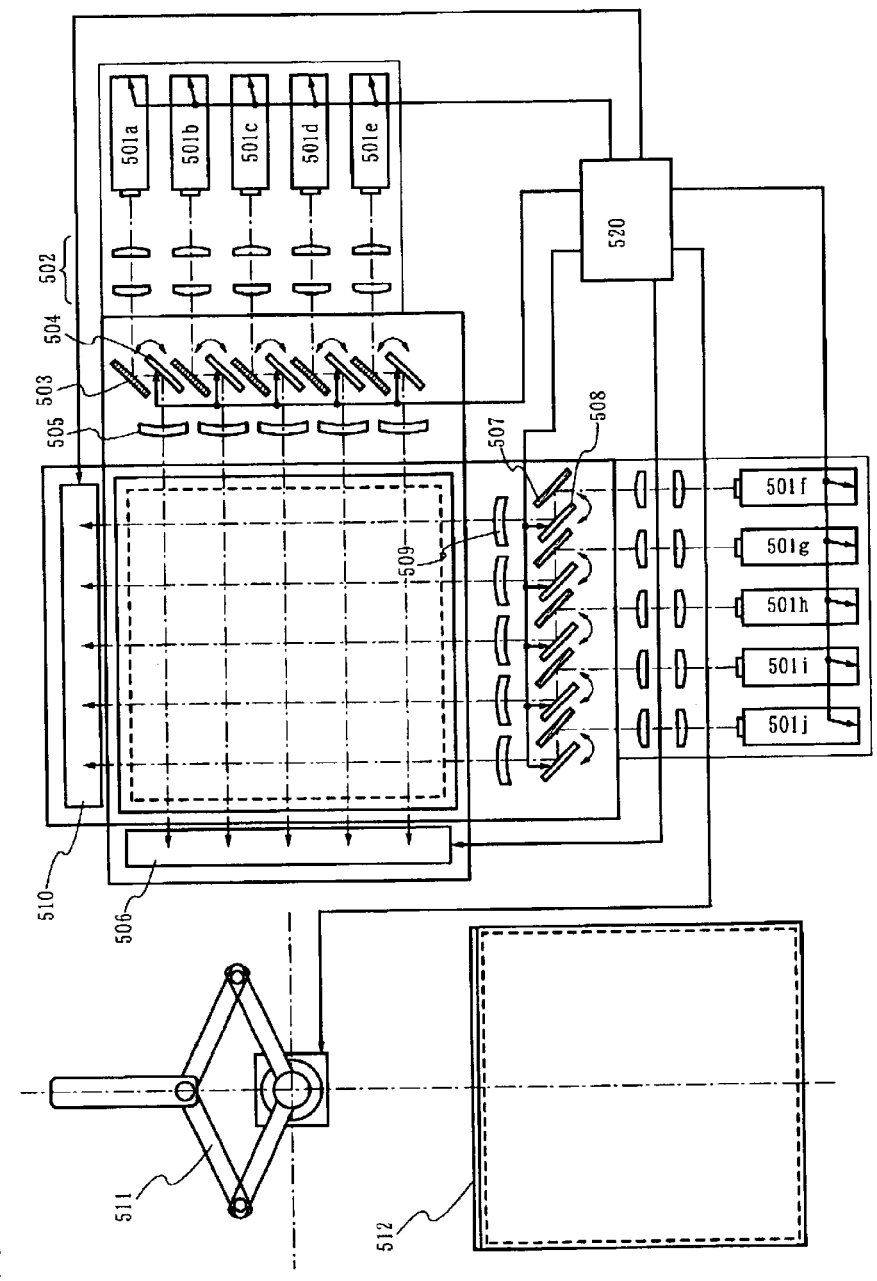
FIG. 8 is a schematic layout showing a mode of a laser irradiation apparatus according to the present invention.

A detailed structure of a laser treatment apparatus of the present invention based on the structure shown in FIG. 4 will be described with reference to FIGS. 6 to 8. FIG. 6 is a top plan view of a laser treatment apparatus of the present invention, and FIGS. 7A and 7B are corresponding cross-sectional views. FIG. 8 is a schematic view for illustrating a connection path for a control signal. Since FIGS. 6 to 8 are interrelated with each other, the same reference symbols are used for description in FIGS. 6 to 8 for convenience.

In FIG. 6, a plurality of laser beams are radiated from two directions, i.e., an x direction and a y direction. A plurality of laser beams emitted from laser oscillation devices 501a to 501e are radiated from the x direction to an object to be treated, by a group of lenses 502, a fixed mirror 503, first movable mirrors 504, fθ lenses 505 and second movable mirrors 506. The laser beam is deflected by a first movable mirror 504 and a second movable mirror 506 to be enabled to scan the irradiated surface of the object to be treated. From the y direction, a plurality of laser beams emitted from laser oscillation devices 501f to 501j are radiated to the object to be treated, by a group of lenses 502, a fixed mirror 507, first movable mirrors 508, fθ lenses 509 and second movable mirrors 510.

As shown in side views of FIGS. 7A and 7B, a path for a laser beam incident from the x direction and that for a laser beam incident from the y direction are placed so as to have a level difference, thereby reducing the size of the apparatus. A stage for holding the object to be treated is placed under the apparatus. In any case, a laser beam incident on the object is incident at a specific angle. A laser beam incident on the object can be radiated to a specific irradiation position by a pair of movable mirrors. The laser beam irradiation, the angles of the first movable mirrors 504 and 508 and the second movable mirrors 506 and 510, and the delivery of the object by a delivering means 511 from and to a cassette 512 holding the object, are controlled in a concentrated manner by a controlling means 520 as shown in FIG. 8.

Laser beam irradiation is performed in an inactive atmosphere, an oxidizing atmosphere, or a reducing atmosphere, depending on its purpose. The object to be treated is provided with a gas supplying means 513 for controlling an atmosphere of a treatment chamber in which the object is placed. Moreover, a gas circulating means 514 for circulating a gas within the treatment chamber is also provided. Although not shown in the figures, a means for controlling the treatment chamber to be under a reduced pressure may be provided.

By scanning laser beams with the above structure of the laser treatment apparatus, an amorphous semiconductor film can be crystallized over the entire surface of a substrate. Moreover, a laser beam is radiated not by scanning the entire surface of the object to be treated. It is possible to radiate a laser beam only to a specific region while specifying the place to be radiated. The above structure of the laser treatment apparatus realizes such radiation by combining a plurality of movable mirrors. Furthermore, the laser beams are superimposed on the same irradiated portion, thereby eliminating the effects of interference.

[Embodiment 2]

The steps of crystallizing an amorphous semiconductor film and forming a TFT by using the obtained crystalline semiconductor film will be described with reference to FIGS. 14(1-A) to 14(2-B). FIG. 14(1-B) is a longitudinal cross-sectional view, showing a non-single crystalline semiconductor film 603 formed on a glass substrate 601. A representative example of the non-single crystalline semiconductor film 603 is an amorphous silicon film. Besides the amorphous silicon film, an amorphous silicon germanium film and the like can be used. Although a film having a thickness of 10 to 200 nm can be used, a thickness may be further increased depending on a wavelength and an energy density of a laser beam. It is desirable to provide a blocking layer 602 between the glass substrate 601 and the non-single crystalline semiconductor film 603 as a means for preventing an impurity such as an alkaline metal from being diffused from the glass substrate into the semiconductor film. A silicon nitride film or a silicon oxynitride film is used as the blocking layer 602.

The crystallization is achieved by irradiation of a laser beam 600, thereby forming a crystalline semiconductor film 604. The laser beam 600 scans, as shown in FIG. 14(1-A), in accordance with the assumed position of a semiconductor region 605 of a TFT. As a beam shape, an arbitrary shape such as a rectangular, a linear or an ellipsoidal shape can be used. It is preferred that the semiconductor region 605 is not situated under the edge of the beam because a laser beam converged through an optical system does not necessarily have a constant energy intensity across the central portion and the edge.

Laser beam scanning is not limited to unidirectional scanning; two-way scanning is also possible. In such a case, the laser energy density is varied for each scanning so as to achieve the crystal growth in a gradational manner. The laser beam scanning also serves as a dehydrogenation treatment that is frequently needed for crystallizing an amorphous silicon film. In this case, after the first scanning is performed at a low energy density so as to release hydrogen, the second scanning may be performed at a higher energy density to achieve the crystallization.

Thereafter, as shown in FIGS. 14(2-A) and 14(2-B), the thus formed crystalline semiconductor film is etched to form the separated island-like semiconductor region 605. In the case of a top gate TFT, a gate insulating film 606, a gate electrode 607 and a one-conductivity type impurity region 608 are formed on the semiconductor region 605 to complete a TFT. Thereafter, a wiring, an interlayer insulating film or the like may be formed as the need arises.

In such a laser beam irradiation method, a continuous wave laser beam is radiated to allow the growth of crystals having a large grain diameter. Certainly, it is necessary to appropriately set particular parameters such as a scanning speed and an energy density of a laser beam. The growth of crystals having a large grain diameter can be realized by setting a scanning speed to 10 to 80 cm/sec. It is said that a crystal growth speed using a pulse laser after melt-solidification is 1 m/sec. The continuous crystal growth at the solid/liquid interface is allowed by scanning a laser beam at a tower speed than the above crystal growth speed and slow cooling, thereby realizing an increased grain diameter of crystals.

[Embodiment 3]

Figure 15A:
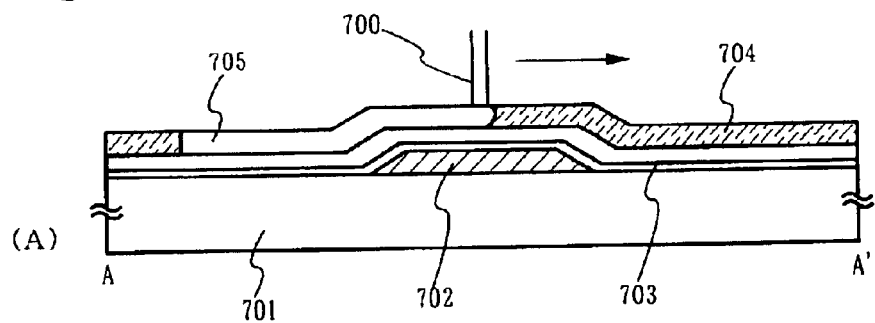
FIGS. 15A and 15B are cross-sectional views illustrating fabrication steps of a bottom-gate type TFT.

A method of manufacturing a TFT described in Embodiment 2 is applicable to a manufacture process of a bottom gate type TFT whose gate electrode is placed between a substrate and a semiconductor film. As shown in FIG. 15A, a gate electrode 702 made of Mo or Cr is formed on a substrate 701. Then, a gate insulating film 703 made of a laminate film of a silicon nitride film and a silicon oxide film is formed. An amorphous silicon film 704 is formed on the gate insulating film 703. By irradiating the gate insulating film 703 with a laser beam 700, a crystalline silicon film 705 can be formed.

Figure 15B:
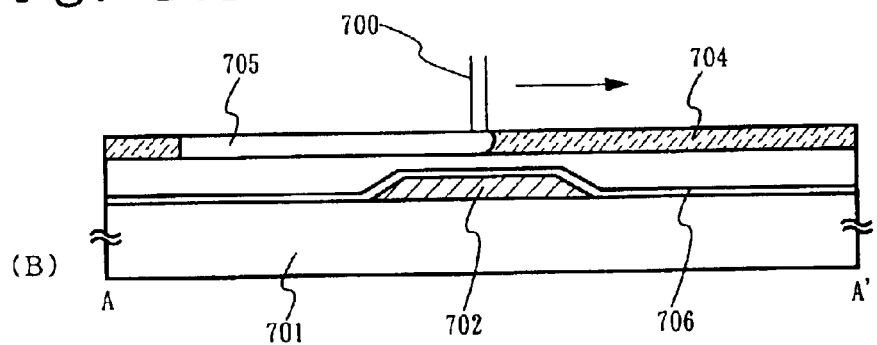

FIG. 15B is a schematic view showing another form of a bottom gate TFT, illustrating the state where a surface of a gate insulating film 706 is leveled. The leveling may be conducted through chemical mechanical polishing (CMP). In the case of the bottom gate type TFT, the gate electrode is formed first, creating a level difference on the surface of the gate insulating film. Since such a level difference has a strong possibility of becoming a base of crystal growth, that is, a crystal nucleus, the level difference becomes a factor of inhibiting uniform crystal growth. Therefore, in order to achieve uniform crystal growth, it is considered to be desirable to level a surface of the gate insulating film.

After formation of the crystalline silicon film 705, a bottom gate TFT can be completed by forming a semiconductor region, a source region and a drain region, and the like in accordance with a known method.

[Embodiment 4]

An example where a CMOS type TFT is manufactured by using a laser treatment apparatus of the present invention will be described with reference to FIGS. 16A to 16E.

Figure 16A:
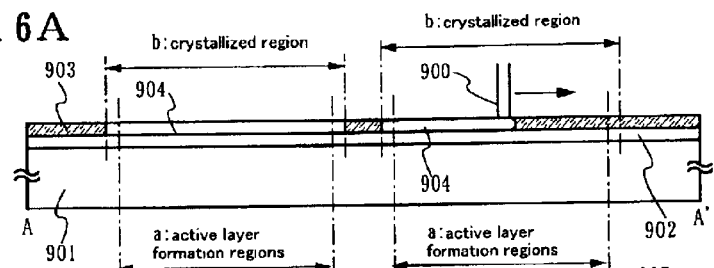
FIGS. 16A to 16E are cross-sectional views illustrating the fabrication steps of a TFT.

In FIG. 16A, a blocking layer 902 is formed using silicon oxynitride to have a thickness of 200 nm on a glass substrate 901 formed of an aluminosilicate glass, a barium borosilicate glass or the like. Thereafter, an amorphous silicon film 903 is formed to a thickness of 100 nm by a plasma CVD method. The crystallization is achieved by irradiation of a continuous wave laser beam 900. It is not necessary to irradiate the entire surface of the amorphous silicon film 903 with the laser beam 900.

Figure 16B:
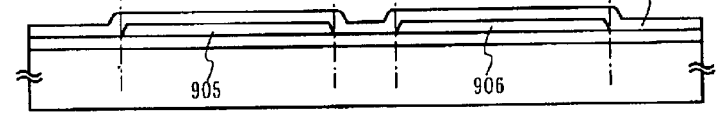
Figure 17A:
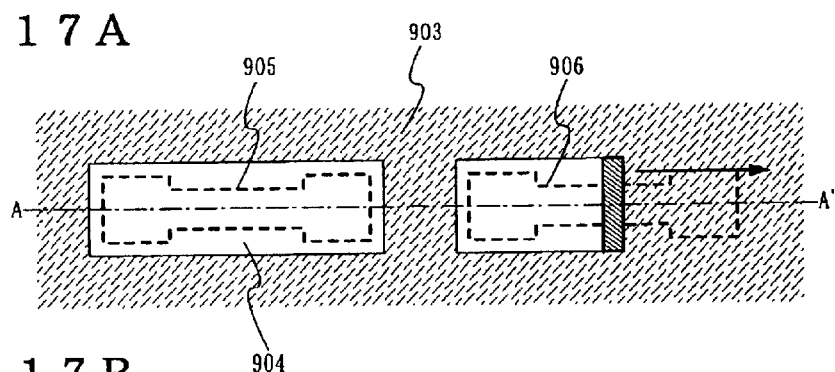
FIGS. 17A and 17B are top plan views illustrating the fabrication steps of a TFT.

FIG. 16B shows the form of active layer formation regions 905 and 906 which are divided in an island-like shape. As can be understood by comparing FIGS. 16A and 16B with each other, the active layer formation regions 905 and 906 are formed so as to be inside the crystallized regions. The crystallization of the amorphous silicon film causes the release of contained hydrogen or the densification due to rearrangement of atoms, thereby producing the shrinkage in volume. Therefore, the continuity of lattices is not ensured at the boundary between an amorphous region and a crystal region, whereby a strain is generated. Forming the active layer formation region 905 of a TFT inside the crystallized region 904 also serves to eliminate the strained region. FIG. 17A is a top plan view showing this state.

The term "active layer" herein indicates a semiconductor region including an impurity region such as a channel formation region, a source/drain region of a TFT, where valence electrons are controlled.

Furthermore, a gate insulating film 907 is formed to a thickness of 80 nm. The gate insulating film 907 is formed of a silicon oxynitride film through a plasma CVD method, using $O_2$ as a reactive gas for $SiH_4$ and $N_2O$. Since the active layer has a high orientation rate of a (100) plane, unevenness of the film quality of the gate insulating film formed on the active layer can be reduced. Thus, variation in threshold voltage of a TFT can be reduced.

Figure 16C:
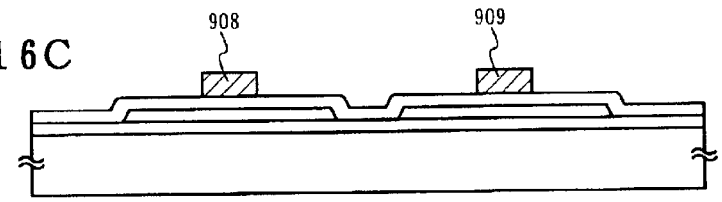

In FIG. 16C, gate electrodes 908 and 909 are formed on the gate insulating film 907. As a material for forming the gate electrodes 908 and 909, an electrically conductive material such as Al, Ta, Ti, W or Mo or an alloy thereof is used. The gate electrodes are formed to a thickness of 400 nm.

Figure 16D:
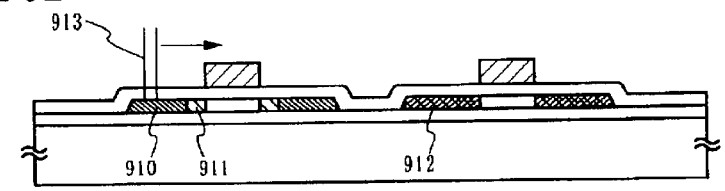

FIG. 16D shows the formation of an impurity region. By ion doping, a source or drain region 910 for an n-channel TFT, a lightly doped drain (LDD) region 911, and a source or drain region 912 for a p-channel TFT are formed.

By ion doping, the crystallinity of a region where an impurity element is injected is destroyed to render the region amorphous. A laser treatment is conducted to realize the recovery of the crystallinity and the reduction in resistance owing to activation of the impurity element. A laser treatment can be conducted with a laser treatment apparatus of the present invention. A laser irradiation may be conducted in a hydrogen atmosphere (reducing atmosphere) so as to also serve as hydrogenation.

Figure 16E:
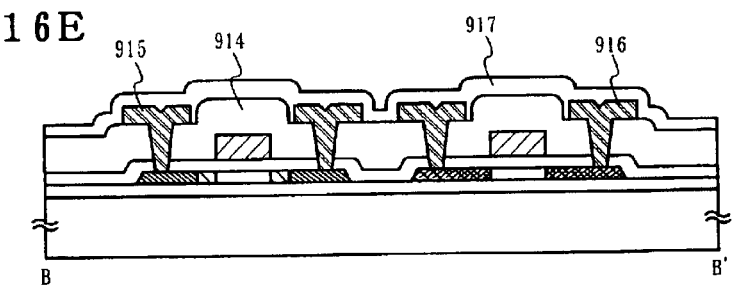
Figure 17B:
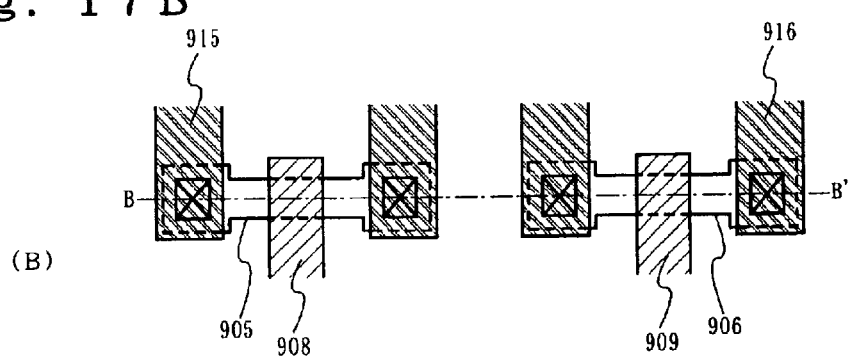

Thereafter, as shown in FIG. 16E, an interlayer insulating film 914 is formed of a silicon nitride film or a silicon oxide film. Then, contact holes reaching the impurity region of each semiconductor film are formed. Wirings 915 and 916 are formed using Al, Ti, Ta and the like. Furthermore, a passivation film 917 is formed of a silicon nitride film. FIG. 17B is a top plan view showing this state.

In this manner, an n-channel TFT and a p-channel TFT can be completed. Although each TFT is herein shown as a single body, a CMOS circuit, an NMOS circuit, or a PMOS circuit can be formed using these TFTs. Since the crystal growth is achieved in parallel to a channel length direction in a crystalline silicon film formed by the present invention, there is substantially no crystal grain boundary traversed by carriers. As a result, a high field effect mobility can be obtained. The thus manufactured TFT can be used as a TFT for manufacturing an active matrix liquid crystal display device or a display device using a light emitting element, or as a TFT for forming a memory or a microprocessor on a glass substrate.

[Embodiment 5]

Figure 18:
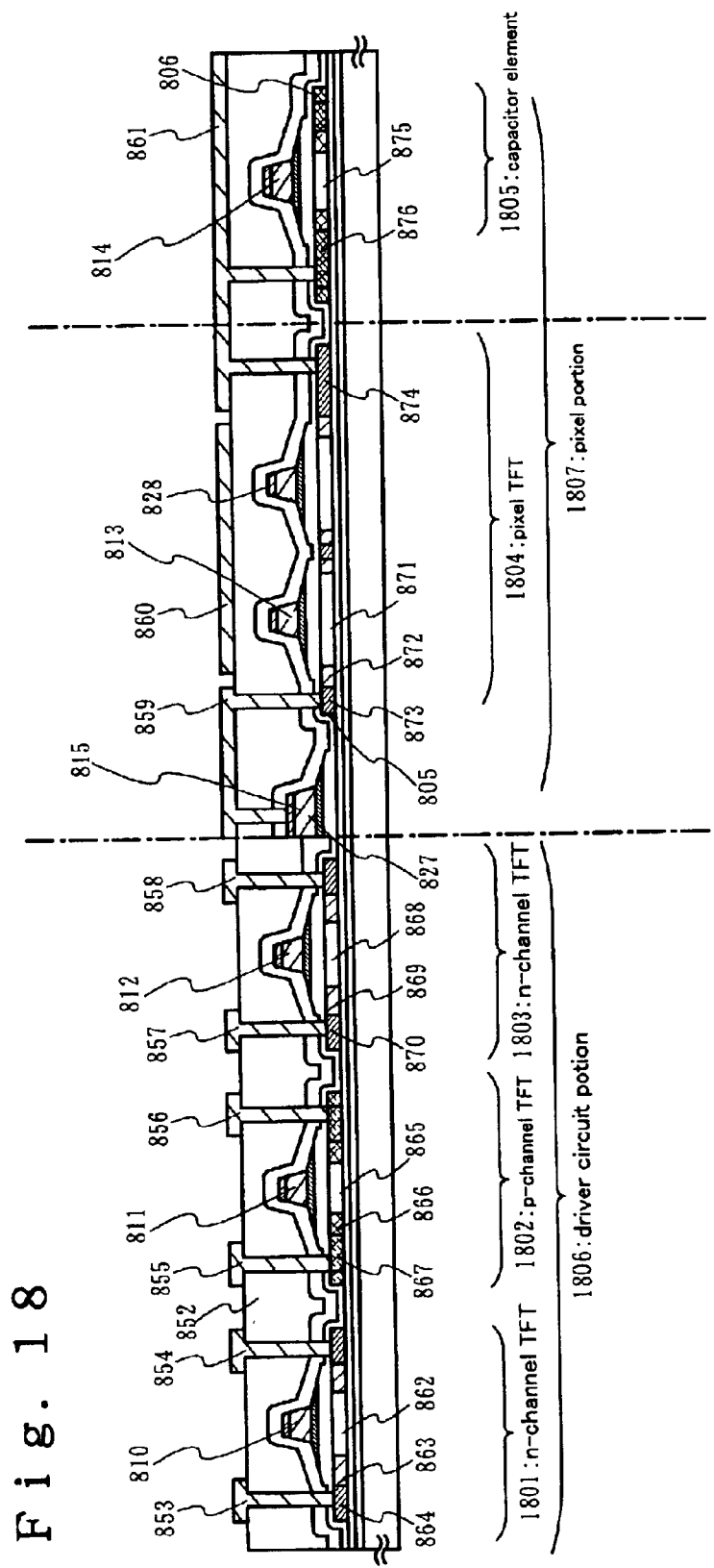
FIG. 18 is a cross-sectional view illustrating the structure of a TFT substrate.

An example of a structure of a TFT substrate (substrate on which TFTs are formed) for realizing an active matrix driving display device using TFTs manufactured in the same manner as in Embodiment 4 will be described with reference to FIG. 18. In FIG. 18, a driver circuit potion 1806 including an n-channel TFT 1801, a p-channel TFT 1802 and an n-channel TFT 1803, and a pixel portion 1807 including a pixel TFT 1804 and a capacitor element 1805, are formed on the same substrate.

The n-channel TFT 1801 in the driver circuit potion 1806 includes a channel formation region 862, a second impurity region 863 partially overlapping a gate electrode 810, and a first impurity region 864 serving as a source region or a drain region. The p-channel TFT 1802 includes a channel formation region 865, a fourth impurity region 866 partially overlapping a gate electrode 811, and a third impurity region 867 serving as a source region or a drain region. The n-channel TFT 1803 includes a channel formation region 868, a second impurity region 869 partially overlapping a gate electrode 812, and a first impurity region 870 serving as a source region or a drain region. With such n-channel TFTs and a p-channel TFT, a shift register circuit, a buffer circuit, a level shifter circuit, a latch circuit or the like can be formed.

The active layer, in which these channel formation regions and the impurity regions are formed, is formed in the same manner as in Embodiment 2. The crystal growth in the active layer is achieved in a channel length direction in parallel to the substrate, thereby remarkably lowering the possibility that carriers traverse the crystal grain boundaries. As a result, a high field effect mobility can be obtained to acquire extremely excellent properties.

The pixel TFT 1804 in the pixel portion 1807 includes a channel formation region 871, a second impurity region 872 formed outside a gate electrode 813, and a first impurity region 873 serving as a source region or a drain region. In a semiconductor film which functions as one of the electrodes of the capacitor element 1805, a third impurity region 876 doped with boron is formed. The capacitor element 1805 is formed with an electrode 814 and a semiconductor film 806, using the insulating film (the same film as the gate insulating film) as a dielectric. Each of the above-mentioned second impurity regions functions as an LDD region, which contains an impurity element for controlling valence electrons at a concentration lower than that of the first impurity regions. The reference symbols 853 to 860 indicate various wirings, and the reference symbol 861 corresponds to a pixel electrode.

In these TFTs, the active layer forming the channel formation regions or the impurity regions has a high orientation rate and is leveled. Therefore, unevenness of the film quality of the gate insulating film formed on the active layer can be reduced. Accordingly, variation in threshold voltage of the TFTs can also be reduced. As a result, TFTs can be driven at a low voltage, providing an advantage that power consumption is reduced. Moreover, since the surface is leveled, the electric field is not concentrated to a convex portion. Thus, it is possible to restrain the degradation due to hot carrier effects generated at, in particular, the edge of a drain. Although a concentration distribution of carriers traveling between a source and a drain becomes high in the vicinity of the boundary with the gate insulating film, the carriers can travel smoothly without being scattered, owing to the smoothened surface. Accordingly, a field effect mobility can be enhanced.

In order to manufacture a liquid crystal display device from such a TFT substrate, it is sufficient to provide an opposing substrate, on which a common electrode is formed, so as to form a gap of about 3 to 8 $\mu$m between the substrates and then to form an orientation film and a liquid crystal layer in the gap. A known technique is applicable to the manufacture.

Figure 19:
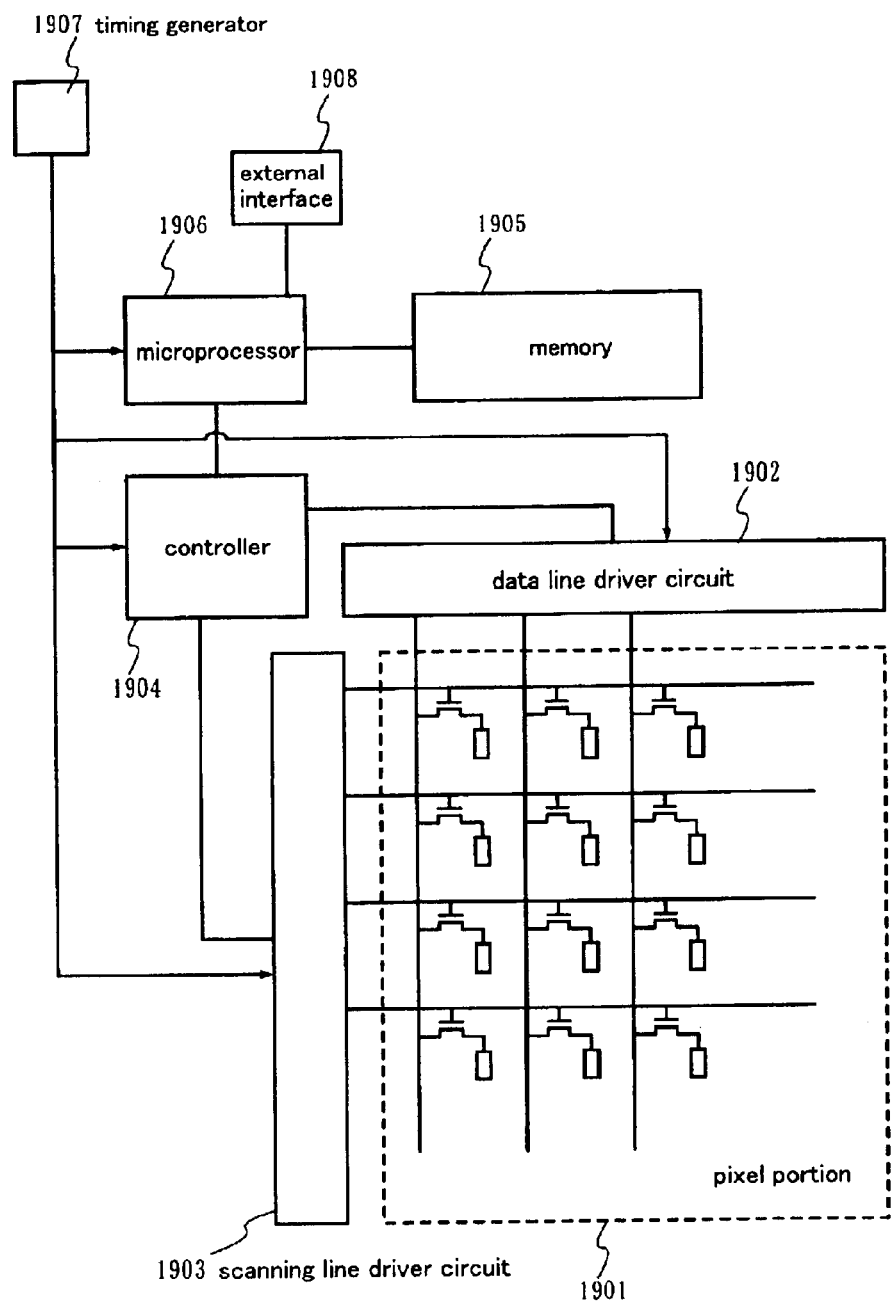
FIG. 19 is a block diagram showing an example of a circuit structure of a TFT substrate.

FIG. 19 shows the circuit structure of an active matrix substrate using the above-described TFT substrate. A driver circuit potion for driving TFTs in a pixel portion 1901 is constituted by a data line driver circuit 1902 and a scanning line driver circuit 1903. A shift register circuit, a buffer circuit, a level shifter circuit, a latch circuit and the like are placed as the need arises. In this case, a data line driver circuit 1902 serves to send a video signal. A video signal from a controller 1904 and a timing signal for the scanning line driver circuit from a timing generator 1907 are input to the data line driver circuit 1902. A timing signal for the data line driver circuit from the timing generator 1907 is input to the scanning line driver circuit 1903, which in turn outputs a signal to a scanning line. A microprocessor 1906 performs the control of the controller 1904, the write of data such as a video signal to a memory 1905, the input and output to/from an external interface 1908, the operation management of the entire system, and the like.

The TFTs for forming these circuits can be formed as TFTs having the structure as described in Embodiment 5. The active layer for forming a channel formation region of a TFT is formed as a region that can be substantially regarded as single-crystalline, thereby improving the properties of TFTs. As a result, various functional circuits can be formed on a substrate such as a glass substrate.

[Embodiment 6]

Figure 20A:
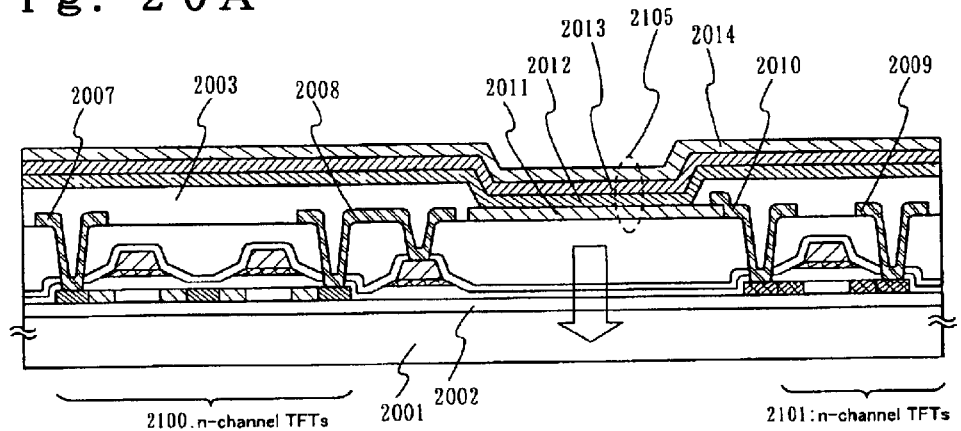
FIGS. 20A and 20B are cross-sectional views showing the structure of a pixel of a semiconductor device provided with a light emitting element.
Figure 20B:
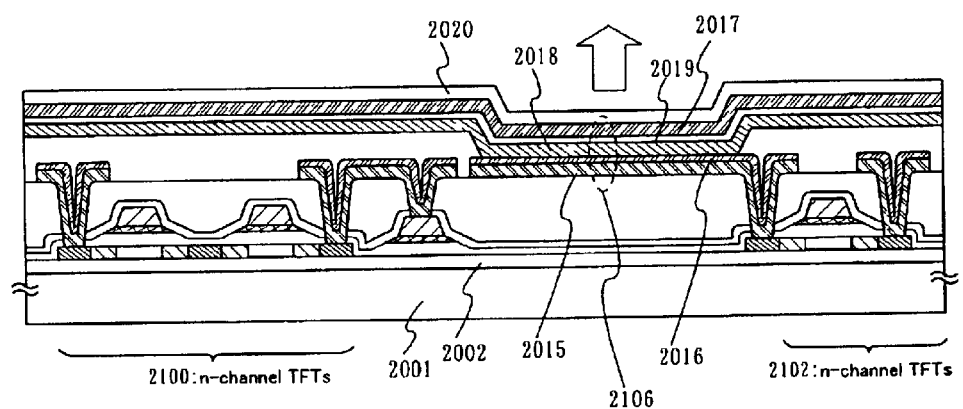

As another example using a TFT substrate, an example of a display device using a light emitting element will be described with reference to the drawings. FIGS. 20A and 20B are cross-sectional views showing a pixel structure of a display device formed by placing a TFT for each pixel. Since n-channel TFTs 2100 and 2102 and a p-channel TFT 2101 shown in FIG. 20 have the same structures as in Embodiment 4, the detailed description thereof is omitted in Embodiment 6.

FIG. 20A shows the structure in which the n-channel TFT 2100 and the p-channel TFT 2101 are formed at a pixel on a substrate 2001 through a blocking layer 2002. In this case, the n-channel TFT 2100 is a TFT for switching whereas the p-channel TFT 2101 is a TFT for current control. A drain side of the p-channel TFT 2101 is connected to one of the electrodes of a light emitting element 2105. The p-channel TFT 2101 is intended for the operation for controlling a current flowing toward the light emitting element 2105. Certainly, the number of TFTs provided at one pixel is not limited; it is possible to provide an appropriate circuit structure in accordance with a driving method of a display device.

The light emitting element 2105 shown in FIG. 20A includes an anode layer 2011, an organic compound layer 2012 containing a light emitter, and a cathode layer 2013. A passivation layer 2014 is formed thereon. The organic compound layer includes: a light emitting layer; a hole injection layer: an electron injection layer: a hole transport layer; an electron transport layer and the like. The luminescence generated from the organic compound includes light emission (fluorescence) caused upon transition from a singlet excited state to a ground state and light emission (phosphorescence) caused upon transition from a triplet excited state to a ground state. The light emission in this example includes either type of light emission, or both types of light emission.

As a material for forming the anode, a material having a high work function such as indium oxide, tin oxide or zinc oxide is used. As a material for the cathode, a material having a low work function, i.e., alkaline metals or alkaline earth metals such as MgAg, AlMg, Ca, Mg, Li, AlLi, and AlLiAg, typically a material made of a magnesium compound, is used. Alternatively, the cathode may be formed by the combination of a thin lithium fluoride layer having a thickness of 1 to 20 nm and an Al layer, or the combination of a thin cesium layer and an Al layer. The anode is connected to a drain side wiring 2010 of the p-channel TFT 2101. A barrier layer 2003 is formed so as to cover the ends of the anode 2011.

The passivation layer 2014 is formed on the light emitting element 2105. A material having high barrier effects against oxygen or moisture, such as silicon nitride, silicon oxynitride or diamond like carbon (DLC), is used to form the passivation layer 2014. With such a structure, light emitted from the light emitting element is radiated from the anode side.

On the other hand, FIG. 20B shows the structure where the n-channel TFT 2100 and the n-channel TFT 2102 are formed at a pixel on the substrate 2001 through the blocking layer 2002. In this case, the n-channel TFT 2100 is a TFT for switching whereas the n-channel TFT 2102 is a TFT for current control. A drain side of the n-channel TFT 2102 is connected to one of the electrodes of a light emitting element 2106.

The light emitting element 2106 includes a film made of a material having a high work function such as indium oxide, tin oxide or zinc oxide as an anode layer 2016, on a wiring 2015 to be connected to the drain side of the n-channel TFT 2102.

The structure of a cathode formed on an organic compound layer 2018 includes a first cathode layer 2019 having a thickness of 1 to 2 nm, formed of a material having a low work function, and a second cathode layer 2017 formed on the first cathode layer 2019, which is provided so as to lower the resistance of the cathode. The first cathode layer 2019 is made of cesium, an alloy of cesium and silver, lithium fluoride, alkaline metals or alkaline earth metals such as MgAg, AlMg, Ca, Mg, Li, AlLi, AlLiAg and the like, typically, a magnesium compound. The second cathode layer 2017 is formed of a metal material such as Al or Ag to have a thickness of 10 to 20 nm, or a transparent conductive film such as indium oxide, tin oxide or zinc oxide to have a thickness of 10 to 100 nm. A passivation film 2020 is formed on the light emitting element 2106. With such a structure, light emitted from the light emitting element is radiated from the cathode side.

As another form of the light emitting element 2106 shown in FIG. 20B, a cathode layer 2016 made of cesium, an alloy of cesium and silver, lithium fluoride, alkaline metals or alkaline earth metals such as MgAg, AlMg, Ca, Mg, Li, AlLi, AlLiAg and the like, typically, a magnesium compound as a cathode material, an organic compound layer 2018, a thin first anode layer 2019 having a thickness of about 1 to 2 nm, and a second anode layer 2017 made of a transparent electrically conductive film may be formed on the wiring 2015 connected to the drain side of the n-channel TFT 2102. The first anode layer 2016 is formed of a material having a high work function such as nickel, platinum or lead by vapor deposition.

In the above-described manner, a display device using an active matrix driving light emitting element can be manufactured. These TFTs include an active layer for forming channel formation regions and impurity regions, which has a high orientation rate and is leveled. Therefore, unevenness of the film quality of the gate insulating film formed on the active layer can be reduced. Accordingly, variation in threshold voltage of a TFT can be reduced. As a result, TFTs can be driven at a low voltage, providing an advantage that power consumption is reduced. Since the TFT for current control connected to the light emitting element is required to have a high current driving capability in this display device, the TFT in this embodiment is suitable for such application. Although not shown herein, the structure in which driver circuit potions are provided in the periphery of a pixel portion, may be the same as in Embodiment 5.

[Embodiment 7]

The present invention can be utilized for various semiconductor devices. Following can be given as such semiconductor devices: a portable information terminal (electronic notebook, mobile computer, portable phone and the like), a video camera, a digital camera, a personal computer, a TV image receiver, a portable phone, a projection display device and the like. Examples of these are shown in FIGS. 21A to 21G and FIGS. 22A to 22D.

FIG. 21A is an example of completing a TV image receiver by implementing this invention and it is composed of a frame 3001, a support stand 3002, a display portion 3003 and the like. The TFT substrate fabricated by this invention is applied in the display portion 3003.

FIG. 21B is an example of completing a video camera by implementing this invention and it is composed of a main body 3011, a display portion 3012, a voice input portion 3013, operation switches 3014, a battery 3015, an image receiving portion 3016 and the like. The TFT substrate fabricated by this invention is applied in the display portion 3012.

FIG. 21C is an example of completing a lap-top by implementing this invention and it is composed of a main body 3021, a frame 3022, a display portion 3023, keyboard 3024 and the like. The TFT substrate fabricated by this invention is applied in the display portion 3023.

FIG. 21D is an example of completing a PDA (Personal Digital Assistant) by implementing this invention and it is composed of a main body 3031, a stylus 3032, a display portion 3033, operation buttons 3034, an external interface 3035 and the like. The TFT substrate fabricated by this invention is applied in the display portion 3033.

FIG. 21E is an example of completing a sound reproducing system, specifically an on-vehicle audio apparatus, by implementing this invention and it is composed of a main body 3041 a display portion 3042, operation switches 3043, 3044 and the like. The TFT substrate fabricated by this invention is applied in the display portion 3042.

FIG. 21F is an example of completing a digital camera by implementing this invention and it is composed of a main body 3051, a display portion A 3052, an eyepiece portion 3053, operation switches 3054, a display portion B 3055, a battery 3056 and the like. The TFT substrate fabricated by this invention is applied in the display portion A 3052 and the display portion B 3055.

FIG. 21G is an example of completing a portable phone by implementing this invention and it is composed of a main body 3061, a voice output portion 3062, a voice input portion 3063, a display portion 3064, operation switches 3065, an antenna 3066 and the like. The TFT substrate fabricated by this invention is applied in the display portion 3064.

Figure 22A:
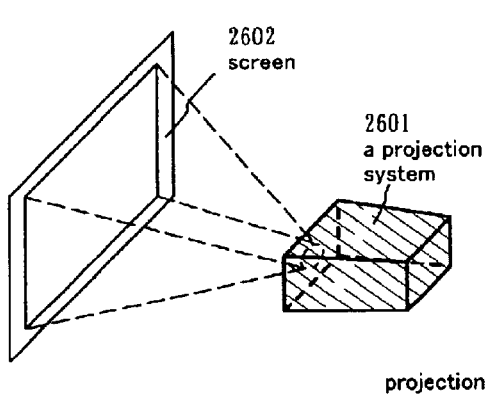
FIGS. 22A to 22D are schematic views showing examples of a semiconductor device.
Figure 22B:
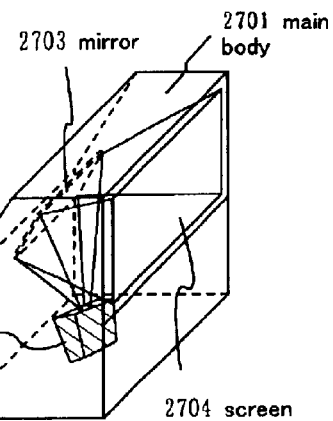

FIG. 22A is a front type projector which comprises a projection system 2601, a screen 2602 and the like. FIG. 22B is a rear type projector which comprises a main body 2701, a projection system 2702, a mirror 2703, a screen 2704 and the like.

Figure 22C:
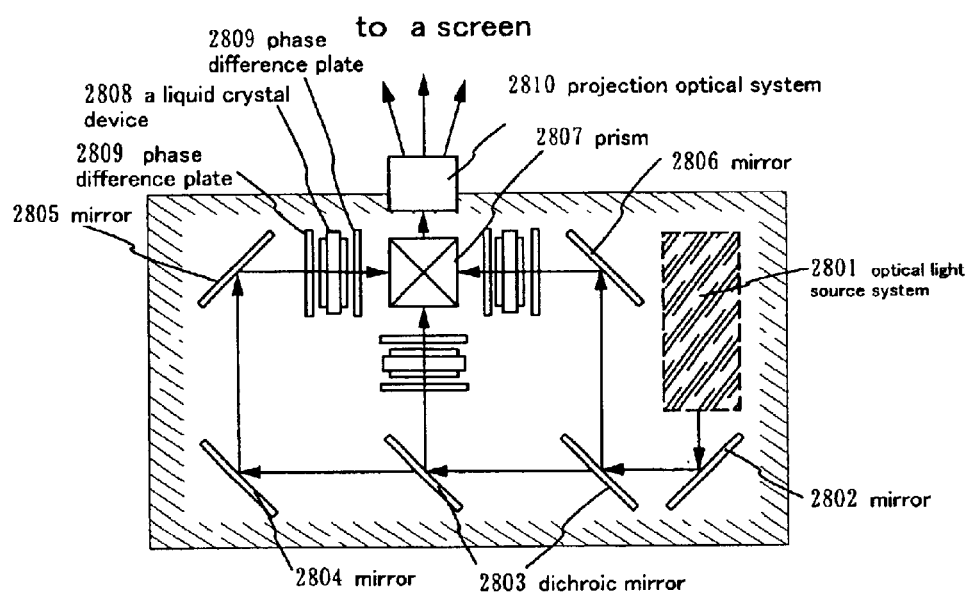

Besides, FIG. 22C is a diagram showing an example of a structure of projection systems 2601 and 2702 in the FIG. 22A and the FIG. 22B. Each of projection systems 2601 and 2702 comprises an optical light source system 2801, mirrors 2802 and 2804 to 2806, a dichroic mirror 2803, a prism 2807, a liquid crystal device 2808, a phase difference plate 2809, and a projection optical system 2810. The projection optical system 2810 comprises an optical system having a projection lens. Though this embodiment shows an example of 3-plate type, this is not to limit to this embodiment and a single plate type may be used for instance. Further, an operator may appropriately dispose an optical lens, a film which has a function to polarize light, a film which adjusts a phase difference or an IR film, etc. in the optical path shown by an arrow in FIG. 22C.

Figure 22D:
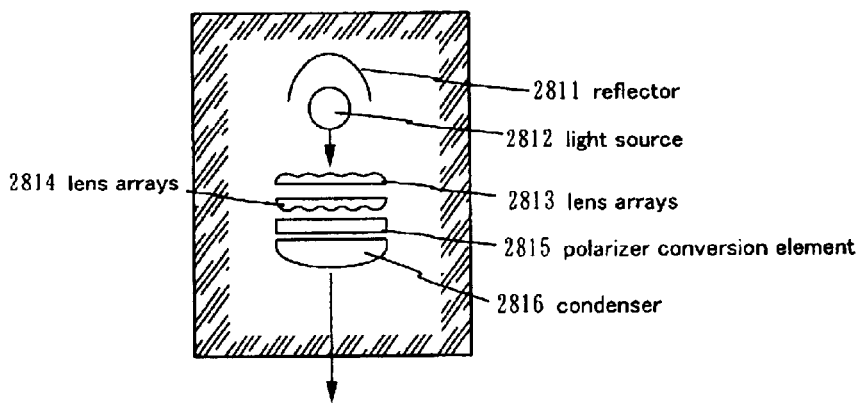

FIG. 22D is a diagram showing an example of a structure of an optical light source system 2801 in FIG. 22C. In this embodiment, the optical light source system 2801 comprises a reflector 2811, a light source 2812, lens arrays 2813 and 2814, a polarizer conversion element 2815, and a condenser 2816. Note that the optical light source system shown in FIG. 22D is merely an example and the structure is not limited to this example. For instance, an operator may appropriately dispose an optical lens, a film which has a function to polarize light, a film which adjusts a phase difference or an IR film, etc.

Besides, electronic devices shown here are merely examples and they are not limited these usages.

As described above, according to the present invention, a laser beam is radiated to the position of a semiconductor region for forming a TFT over the entire surface of a large substrate so as to achieve the crystallization, thereby forming a crystalline semiconductor film having a large grain diameter with high throughput. Moreover, the properties of a TFT can be improved.

In particular, owing to the structure of a laser treatment apparatus of the present invention, a laser beam having a sufficiently high energy density to melt a semiconductor can be radiated without causing interference in the irradiated portion. Furthermore, a laser beam is scanned by a deflection means to achieve the crystallization of an amorphous semiconductor film over the entire surface of a large substrate. Alternatively a specified region on the large substrate can be selectively crystallized by the deflection means. Moreover, a plurality of laser beams are superimposed on the same irradiated portion by the deflection means to eliminate the effects of interference.

Therefore, according to the present invention, a laser beam is radiated to the position of a semiconductor region for forming a TFT over the entire surface of a large substrate so as to achieve the crystallization, thereby forming a crystalline semiconductor film with high throughput and improving the properties of a TFT.

What is claimed is:

1. A method of manufacturing a semiconductor device, comprising:
using first deflection means for deflecting a plurality of laser beams in a main scanning direction and second deflection means for scanning in a sub scanning direction to scan the plurality of laser beams in one direction so as to crystallize a semiconductor film having an amorphous structure formed over an insulating surface.

2. A method of manufacturing a semiconductor device, comprising:
using first deflection means for deflecting a plurality of laser beams in a main scanning direction and second deflection means for scanning in a sub scanning direction to scan the plurality of laser beams in a channel length direction so as to crystallize a semiconductor film having an amorphous structure formed over an insulating surface.

3. A method of manufacturing a semiconductor device, comprising:
using first deflection means for deflecting a plurality of first laser beams in a first main scanning direction, second deflection means for scanning in a first sub scanning direction, third deflection means for deflecting a plurality of second laser beams in a second main scanning direction, and fourth deflection means for scanning in a second sub scanning direction to scan the plurality of first and second laser beams in one direction so as to crystallize a semiconductor film having an amorphous structure formed over an insulating surface.

4. A method of manufacturing a semiconductor device, comprsing:
using first deflection means for deflecting a plurality of first laser beams in a first main scanning direction, second deflection means for scanning in a first sub scanning direction, third deflection means for deflecting a plurality of second laser beams in a second main scanning direction, and fourth deflection means for scanning in a second sub scanning direction to scan the plurality of first and second laser beams in a channel length direction so as to crystallize a semiconductor film having an amorphous structure formed over an insulating surface.

5. A method of manufacturing a semiconductor device, comprising:
using first deflection means for deflecting a plurality of laser beams in a main scanning direction and second deflection means for scanning in a sub scanning direction to scan the plurality of laser beams in one direction so as to recover crystallinity of an ion implanted region of a non-single crystalline semiconductor.

6. A method of manufacturing a semiconductor device, comprising:
using first deflection means for deflecting a plurality of laser beams in a main scanning direction and second deflection means for scanning in a sub scanning direction to scan the plurality of laser beams in a channel length direction so as to recover crystallinity of an ion implanted region of a non-single crystalline semiconductor.

7. A method of manufacturing a semiconductor device, comprising:

using first deflection means for deflecting a plurality of first laser beams in a first main scanning direction, second deflection means for scanning in a first sub scanning direction, third deflection means for deflecting a plurality of second laser beams in a second main scanning direction, and fourth deflection means for scanning in a second sub scanning direction to scan the plurality of first and second laser beams in one direction so as to recover crystallinity of an ion implanted region of a non-single crystalline semiconductor.

8. A method of manufacturing a semiconductor device, comprising:

using first deflection means for deflecting a plurality of first laser beams in a first main scanning direction, second deflection means for scanning in a first sub scanning direction, third deflection means for deflecting a plurality of second laser beams in a second main scanning direction, and fourth deflection means for scanning in a second sub scanning direction to scan the plurality of first and second laser beams in a channel length direction so as to recover crystallinity of an ion implanted region of a non-single crystalline semiconductor.

9. A method of manufacturing a semiconductor device according to any one of claims 1 to 4, wherein the plurality of laser beams are interruptedly radiated to crystallize a selected region of the semiconductor film having the amorphous structure.

10. A method of manufacturing a semiconductor device according to any one of claims 1 to 8, wherein the laser beam is output from a solid laser oscillation device in a continuous oscillation mode.

11. A method of manufacturing a semiconductor device according to any one of claims 1 to 8, wherein the laser beam is a continuous wave laser beam having a wavelength of 400 nm or longer.

12. A method of manufacturing a semiconductor device, comprising:

using a first movable mirror for deflecting a plurality of laser beams in a main scanning direction and a second movable mirror for scanning in a sub scanning direction to scan the plurality of laser beams in one direction so as to crystallize a semiconductor film having an amorphous structure formed over an insulating surface.

13. A method of manufacturing a semiconductor device, comprising:

using a first movable mirror for deflecting a plurality of laser beams in a main scanning direction and a second movable mirror for scanning in a sub scanning direction to scan the plurality of laser beams in a channel length direction so as to crystallize a semiconductor film having an amorphous structure formed over an insulating surface.

14. A method of manufacturing a semiconductor device, comprising:

using a first movable mirror for deflecting a plurality of first laser beams in a first main scanning direction, a second movable mirror for scanning in a first sub scanning direction, a third movable mirror for deflecting a plurality of second laser beams in a second main scanning direction, and a fourth movable mirror for scanning in a second sub scanning direction to scan the plurality of first and second laser beams in one direction so as to crystallize a semiconductor film having an amorphous structure formed over an insulating surface.

15. A method of manufacturing a semiconductor device, comprising:

using a first movable mirror for deflecting a plurality of first laser beams in a first main scanning direction, a second movable mirror for scanning in a first sub scanning direction, a third movable mirror for deflecting a plurality of second laser beams in a second main scanning direction, and a fourth movable mirror for scanning in a second sub scanning direction to scan the plurality of first and second laser beams in a channel length direction so as to crystallize a semiconductor film having an amorphous structure formed over an insulating surface.

16. A method of manufacturing a semiconductor device, comprising:

using a first movable mirror for deflecting a plurality of laser beams in a main scanning direction and a second movable mirror for scanning in a sub scanning direction to scan the plurality of laser beams in one direction so as to recover crystallinity of an ion implanted region of a non-single crystalline semiconductor.

17. A method of manufacturing a semiconductor device, comprising:

using a first movable mirror for deflecting a plurality of laser beams in a main scanning direction and a second movable mirror for scanning in a sub scanning direction to scan the plurality of laser beams in a channel length direction so as to recover crystallinity of an ion implanted region of a non-single crystalline semiconductor.

18. A method of manufacturing a semiconductor device, comprising:

using a first movable mirror for deflecting a plurality of first laser beams in a first main scanning direction, a second movable mirror for scanning in a first sub scanning direction, a third movable mirror for deflecting a plurality of second laser beams in a second main scanning direction, and a fourth movable mirror for scanning in a second sub scanning direction to scan the plurality of first and second laser beams in one direction so as to recover crystallinity of an ion implanted region of a non-single crystalline semiconductor.

19. A method of manufacturing a semiconductor device, comprising:

using a first movable mirror for deflecting a plurality of first laser beams in a first main scanning direction, a second movable mirror for scanning in a first sub scanning direction, a third movable mirror for deflecting a plurality of second laser beams in a second main scanning direction, and a fourth movable mirror for scanning in a second sub scanning direction to scan the plurality of first and second laser beams in a channel length direction so as to recover crystallinity of an ion implanted region of a non-single crystalline semiconductor.

20. A method of manufacturing a semiconductor device according to any one of claims 12 to 15, wherein the plurality of laser beams are interruptedly radiated to crystallize a selected region of the semiconductor film having the amorphous structure.

21. A method of manufacturing a semiconductor device according to any one of claims 12 to 19, wherein the laser beam is output from a solid laser oscillation device in a continuous oscillation mode.

22. A method of manufacturing a semiconductor device according to any one of claims 12 to 19, wherein the laser beam is a continuous wave laser beam having a wavelength of 400 nm or longer.

* * * * *